US009780105B2

(12) United States Patent
Yamada

(10) Patent No.: US 9,780,105 B2
(45) Date of Patent: Oct. 3, 2017

(54) SEMICONDUCTOR MEMORY DEVICE INCLUDING A PLURALITY OF COLUMNAR STRUCTURES AND A PLURALITY OF ELECTRODE FILMS

(71) Applicant: Toshiba Memory Corporation, Minato-ku (JP)

(72) Inventor: Yuki Yamada, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/200,254

(22) Filed: Jul. 1, 2016

(65) Prior Publication Data
US 2017/0194341 A1    Jul. 6, 2017

Related U.S. Application Data

(60) Provisional application No. 62/272,733, filed on Dec. 30, 2015.

(51) Int. Cl.
*H01L 27/115* (2017.01)
*H01L 27/11556* (2017.01)
*H01L 27/11519* (2017.01)
*H01L 27/11582* (2017.01)
*H01L 27/11565* (2017.01)
*H01L 23/528* (2006.01)
*H01L 21/311* (2006.01)
*H01L 21/3213* (2006.01)

(52) U.S. Cl.
CPC .. *H01L 27/11556* (2013.01); *H01L 21/31144* (2013.01); *H01L 21/32139* (2013.01); *H01L 23/528* (2013.01); *H01L 27/11519* (2013.01); *H01L 27/11565* (2013.01); *H01L 27/11582* (2013.01)

(58) Field of Classification Search
CPC ......... C09K 11/06; H01L 51/56; H01L 43/08; H01L 43/12; H01L 51/5253
USPC .................................................. 257/315, 324
See application file for complete search history.

(56) References Cited

U.S. PATENT DOCUMENTS 8,154,068 B2  4/2012 Katsumata et al.
8,198,670 B2  6/2012 Aoyama
(Continued)

FOREIGN PATENT DOCUMENTS

JP   4969707 B2   7/2012

*Primary Examiner* — Andy Huynh
(74) *Attorney, Agent, or Firm* — Oblon, McClelland, Maier & Neustadt, L.L.P.

(57) ABSTRACT

A semiconductor memory device according to one embodiment, includes a stacked body including a plurality of electrode films stacked separated from each other along a first direction, a plurality of columnar structures extending in the first direction, piercing the stacked body, and including a semiconductor layer, a charge storage film provided between one of the columnar structures and the electrode films, and an insulating film dividing one of the electrode films disposed in an upper portion of the stacked body and not dividing other one of the electrode films disposed in a lower portion of the stacked body. A shortest distance between the columnar structures disposed on one side of the insulating film being shorter than a shortest distance between the columnar structures disposed with the insulating film interposed between the columnar structures.

17 Claims, 23 Drawing Sheets

(56) References Cited

U.S. PATENT DOCUMENTS

| | | | |
|---|---|---|---|
| 8,787,061 B2 | 7/2014 | Kono | |
| 8,987,805 B2 | 3/2015 | Nam et al. | |
| 2008/0173928 A1* | 7/2008 | Arai | H01L 29/7926 |
| | | | 257/316 |
| 2012/0098050 A1* | 4/2012 | Shim | H01L 27/11578 |
| | | | 257/324 |
| 2012/0181500 A1 | 7/2012 | Tsuji et al. | |
| 2012/0299086 A1* | 11/2012 | Lee | H01L 27/1157 |
| | | | 257/324 |
| 2014/0063890 A1 | 3/2014 | Lee et al. | |
| 2015/0001460 A1 | 1/2015 | Kim et al. | |
| 2016/0268299 A1* | 9/2016 | Masuda | H01L 27/11582 |

* cited by examiner

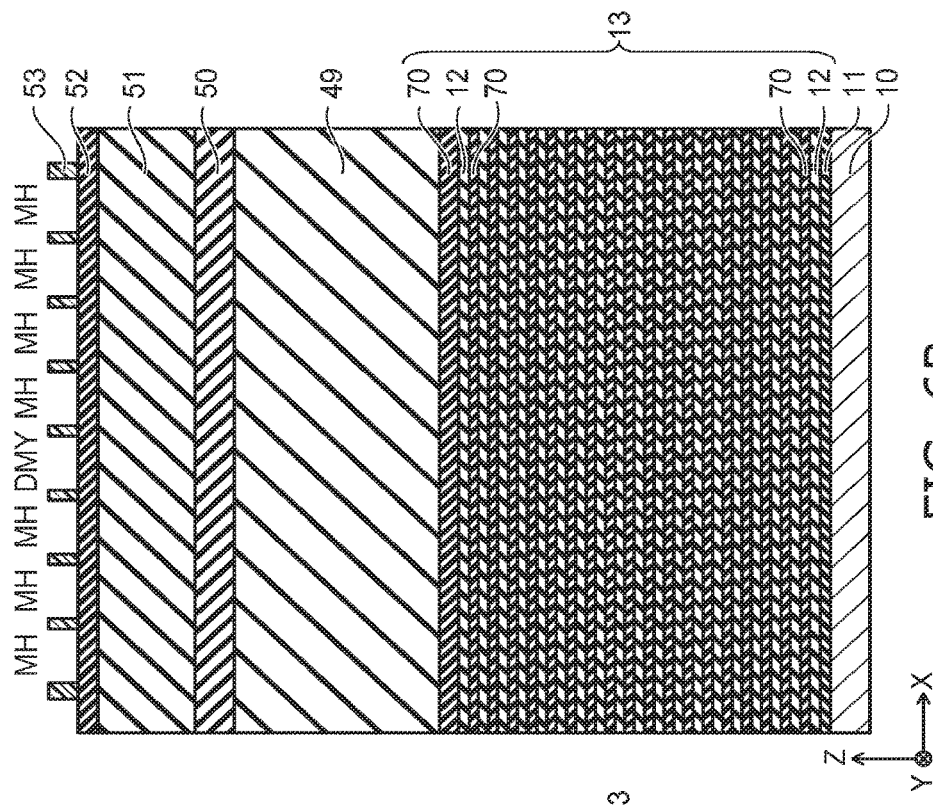
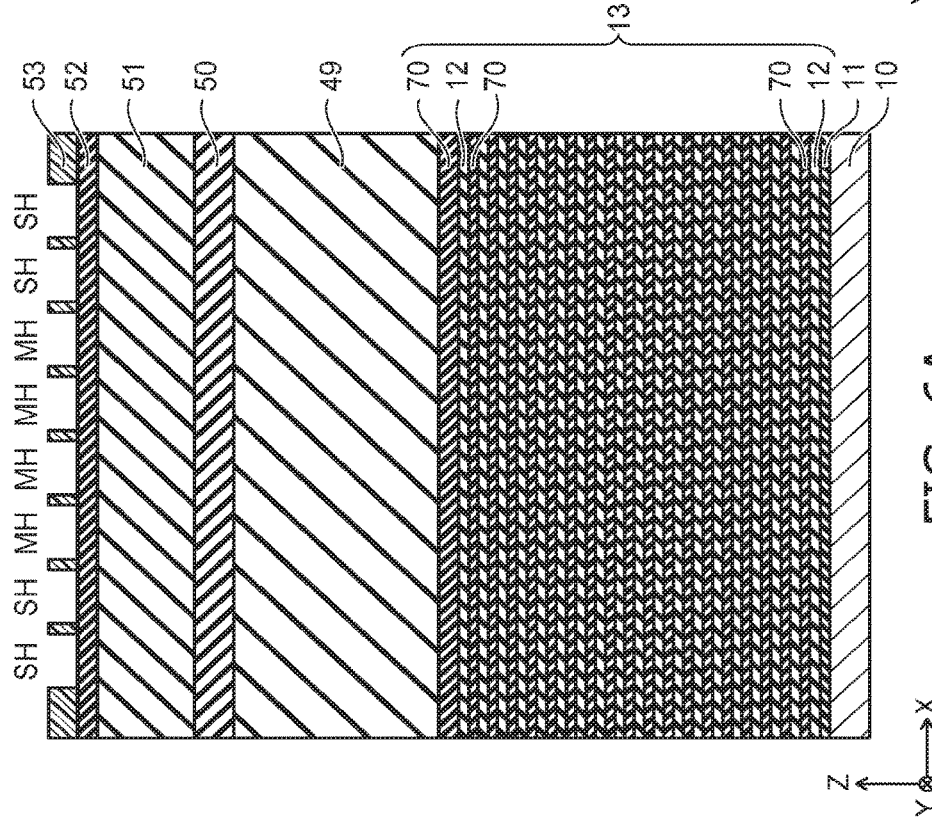
FIG. 6A
FIG. 6B

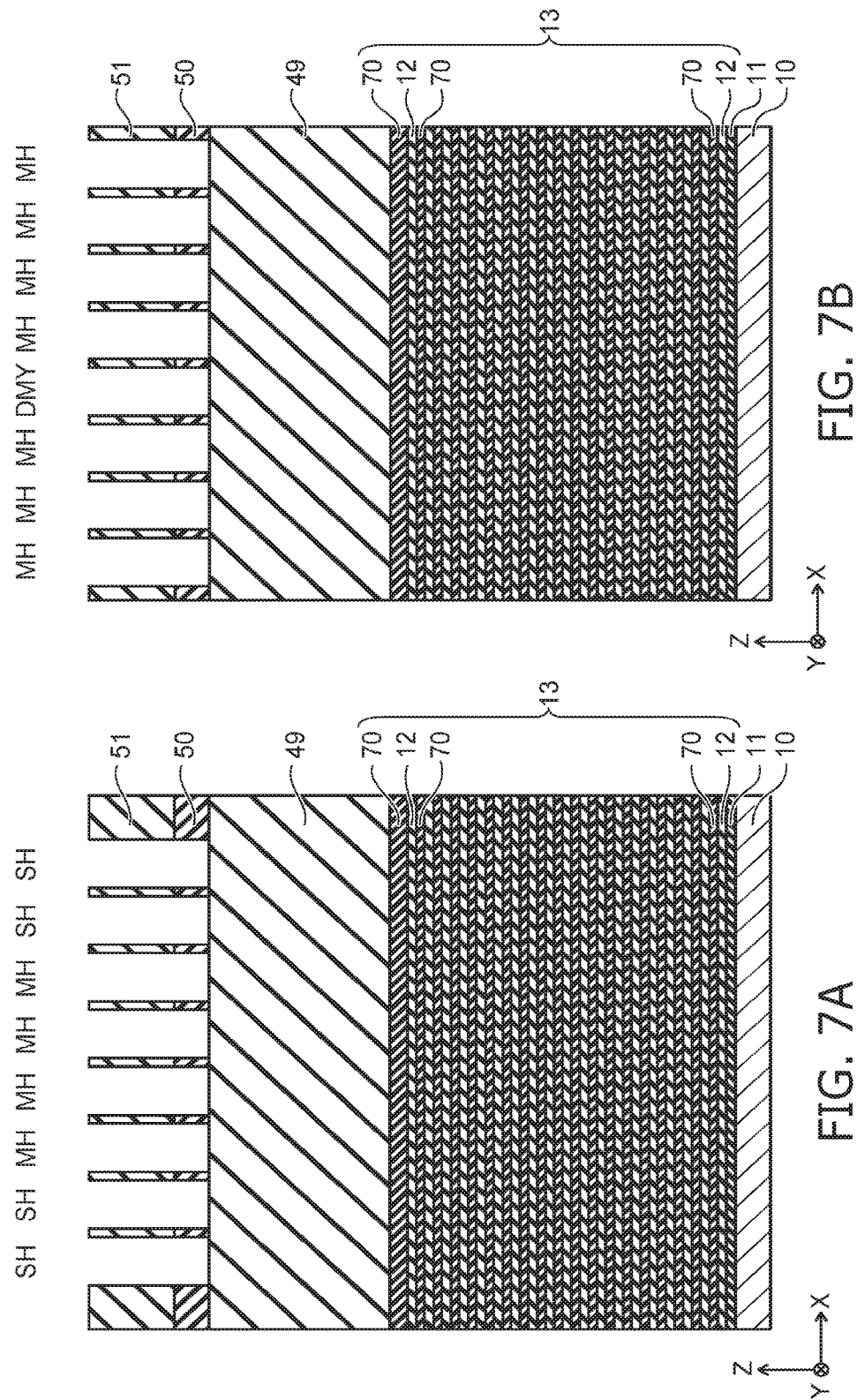

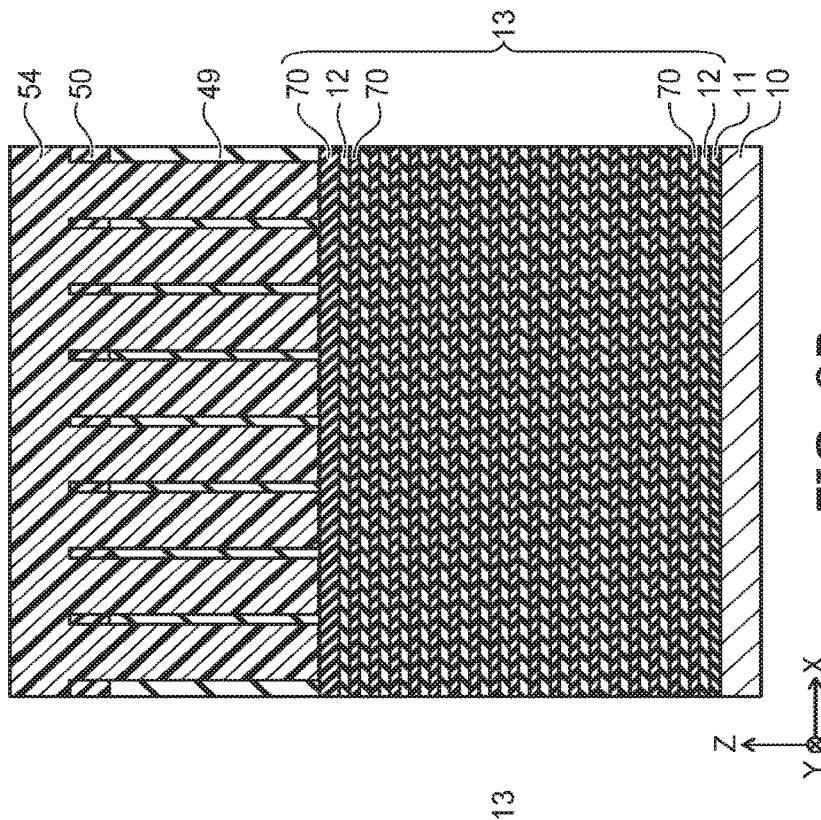
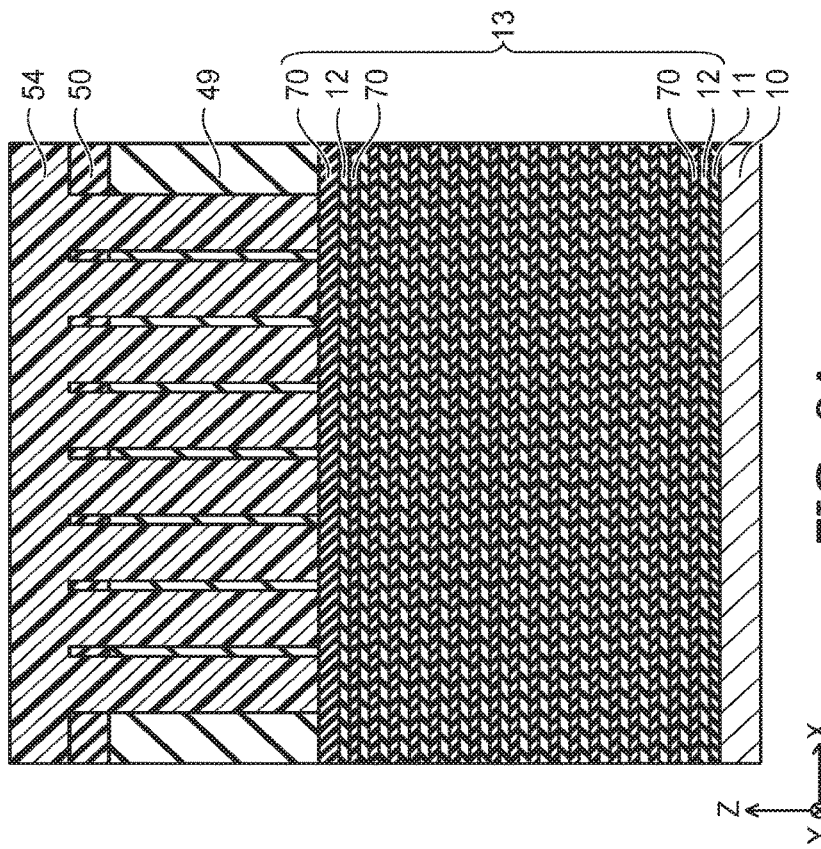
FIG. 9A
FIG. 9B

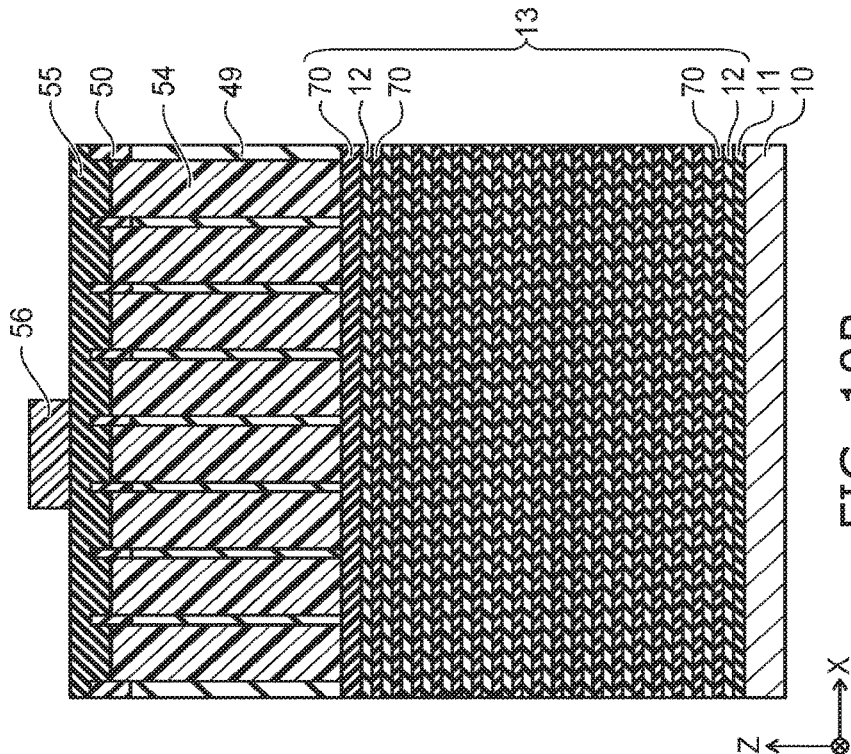
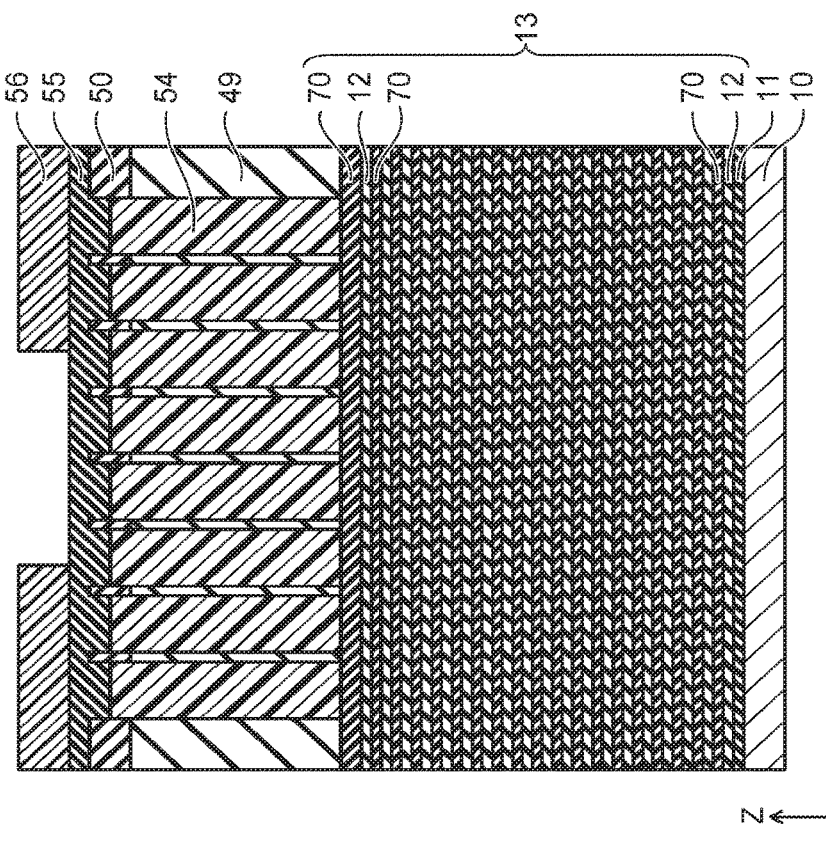
FIG. 10A
FIG. 10B

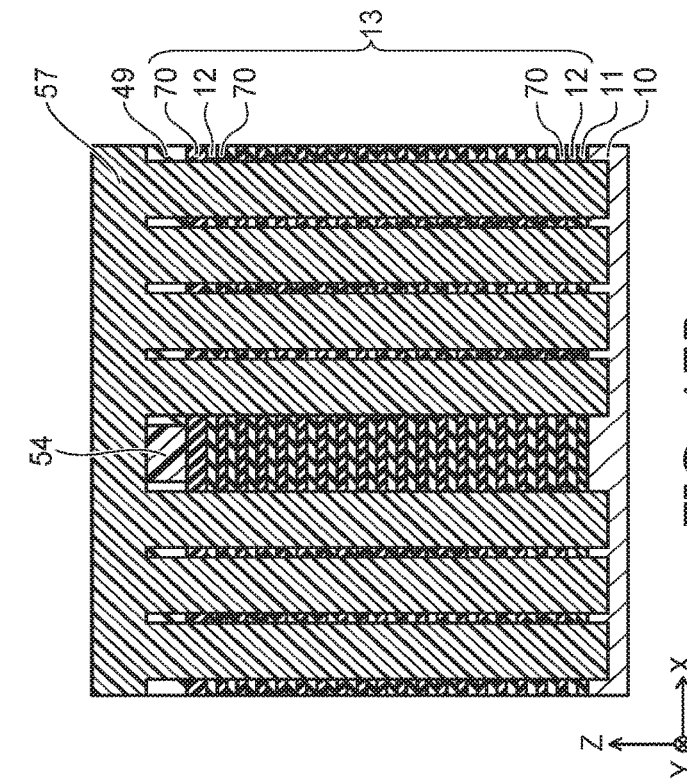
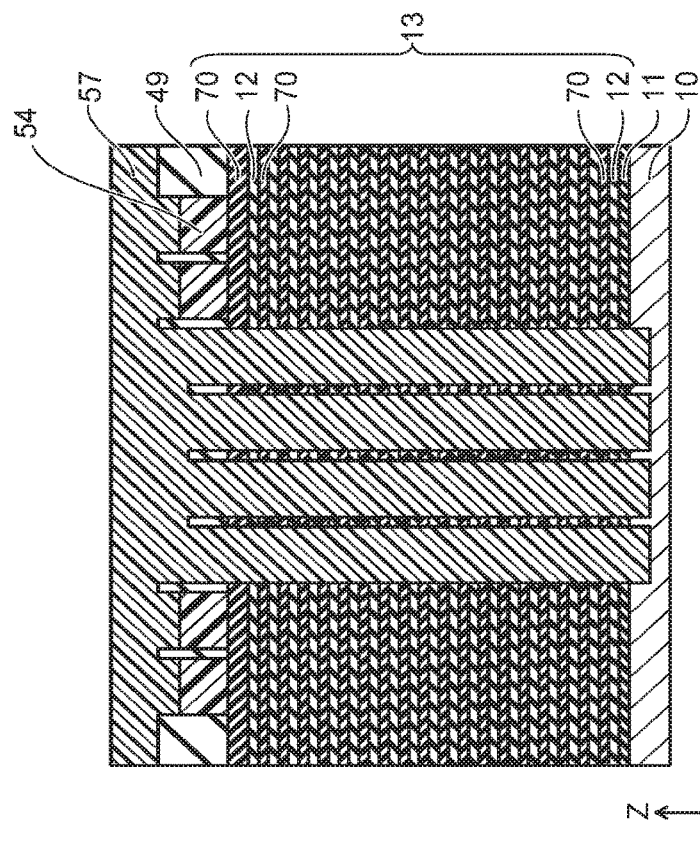
FIG. 17A
FIG. 17B

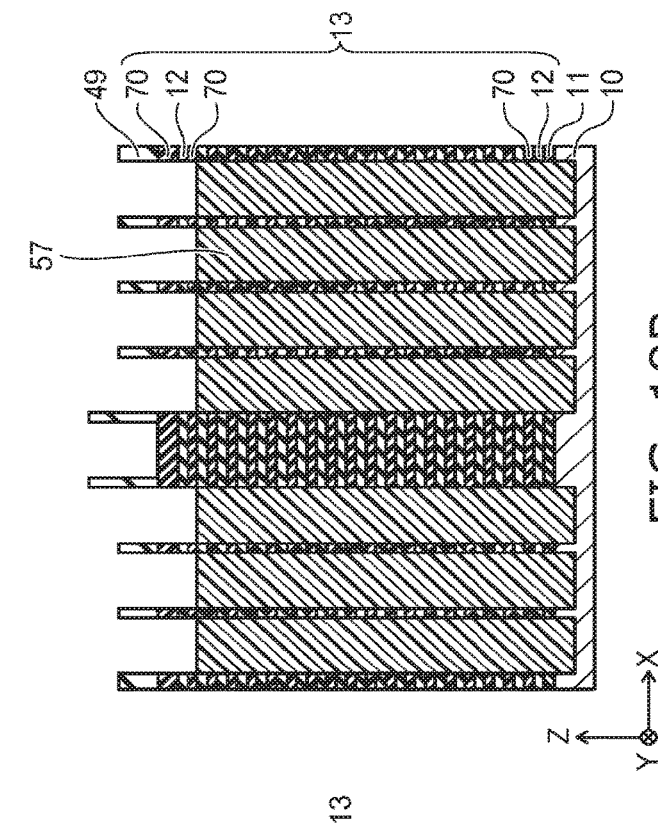
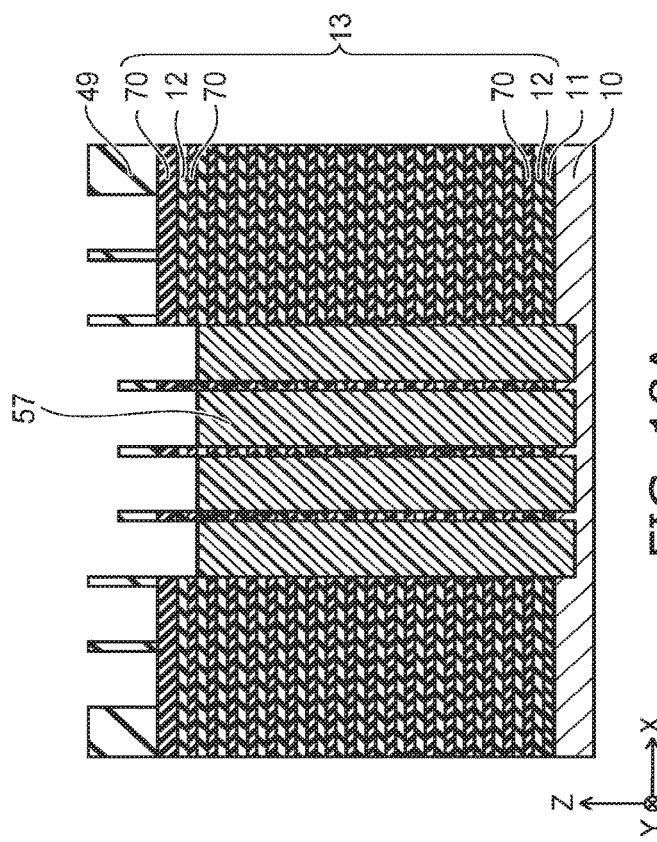
FIG. 18A
FIG. 18B

SEMICONDUCTOR MEMORY DEVICE INCLUDING A PLURALITY OF COLUMNAR STRUCTURES AND A PLURALITY OF ELECTRODE FILMS

CROSS-REFERENCE TO RELATED APPLICATION

This application is based upon and claims the benefit of priority from U.S. Provisional Patent Application 62/272,733, filed on Dec. 30, 2015; the entire contents of which are incorporated herein by reference.

FIELD

Embodiments relate to a semiconductor memory device.

BACKGROUND

A stacked-type semiconductor memory device including a stacked body that includes conductive films and insulating films alternately stacked and a columnar structure that pierces through this stacked body has been proposed. In the stacked-type semiconductor memory device, a memory cell is provided at each crossing portions between the columnar structure and the conductive films. In the stacked-type semiconductor memory device, high-speed operation is desired.

BRIEF DESCRIPTION OF THE DRAWINGS

FIG. 6A to FIG. 20B are sectional views illustrating a method for manufacturing a semiconductor memory device according to the embodiment.

DETAILED DESCRIPTION

A semiconductor memory device according to one embodiment, includes a stacked body, a plurality of columnar structures, a charge storage film, and an insulating film. The stacked body includes a plurality of electrode films stacked along a first direction and separated from each other. The plurality of columnar structures extends in the first direction, piercing the stacked body, and including a semiconductor layer. The charge storage film is provided between one of the columnar structures and the electrode films. The insulating film divides one of the electrode films disposed in an upper portion of the stacked body and does not divide other one of the electrode films disposed in a lower portion of the stacked body. A shortest distance between the columnar structures disposed on one side of the insulating film is shorter than a shortest distance between the columnar structures disposed with the insulating film interposed between the columnar structures.

Embodiments will now be described with reference to the drawings.

Figure 1:
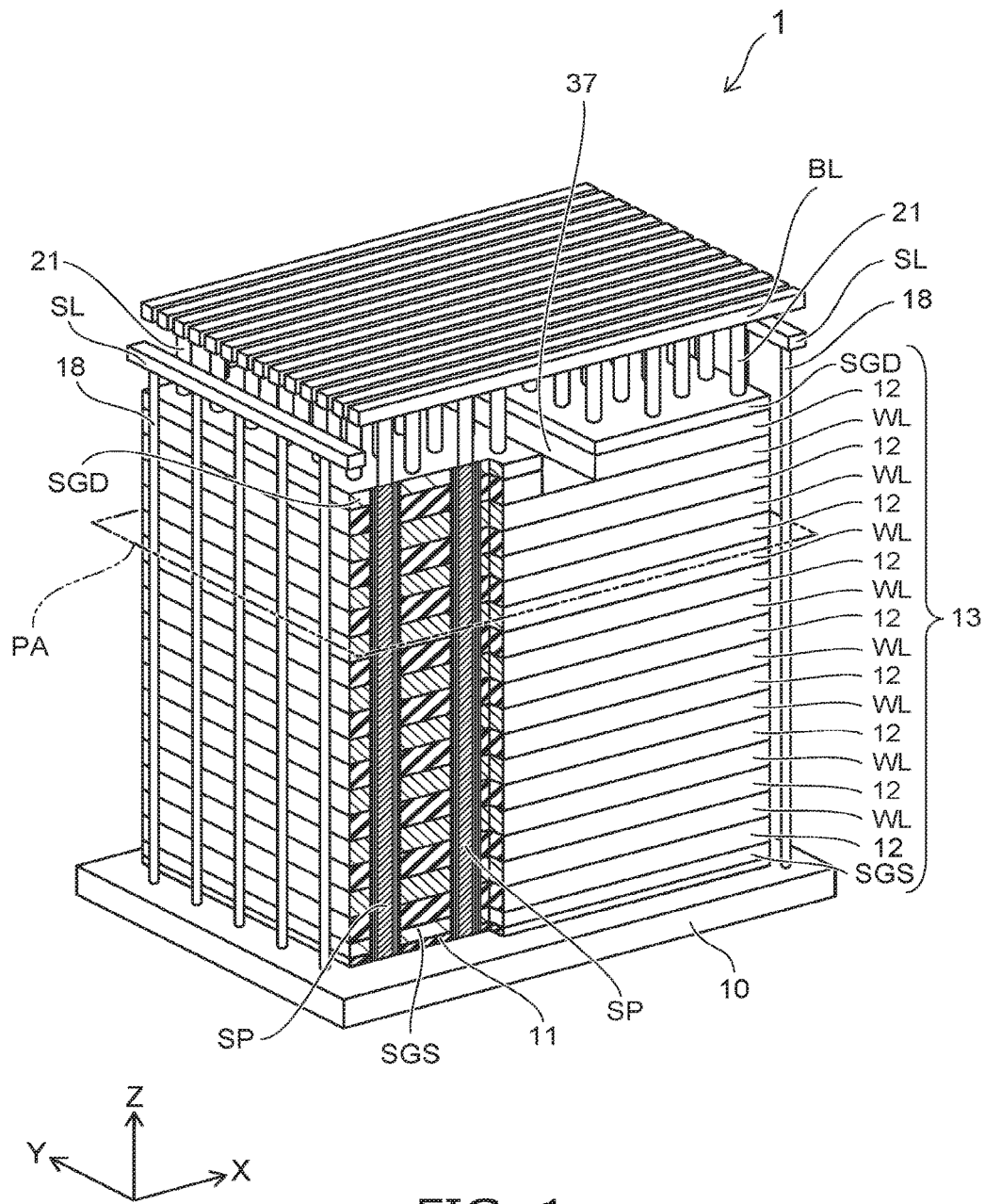
FIG. 1 is a perspective view illustrating a semiconductor memory device according to an embodiment.

FIG. 1 is a perspective view illustrating a semiconductor memory device according to the embodiment.

As shown in FIG. 1, in the semiconductor memory device 1 according to the embodiment, a silicon substrate 10 is provided. Hereinafter, for convenience of description in the specification, an XYZ orthogonal coordinate system is employed. Two directions parallel to an upper surface of the silicon substrate 10 and orthogonal to each other are defined as an "X-direction" and a "Y-direction", and a direction vertical to the upper surface of the silicon substrate 10 is defined as a "Z-direction".

An insulating film 11 is provided on the silicon substrate 10. On the insulating film 11, a stacked body 13 is provided. In the stacked body 13, a source-side select gate electrode SGS, a plurality of insulating films 12, a plurality of word lines WL, and a drain-side select gate electrode SGD are stacked along the Z-direction. The insulating films 12 and the word lines WL are alternately stacked. In the stacked body 13, a single or plurality of drain-side select gate electrodes SGD is provided. Each of the drain-side select gate electrodes SGD is divided in the X-direction, and an insulating film 37 is provided between the drain-side select gate electrodes. The insulating film 37 extends in the Y-direction.

Figure 2:
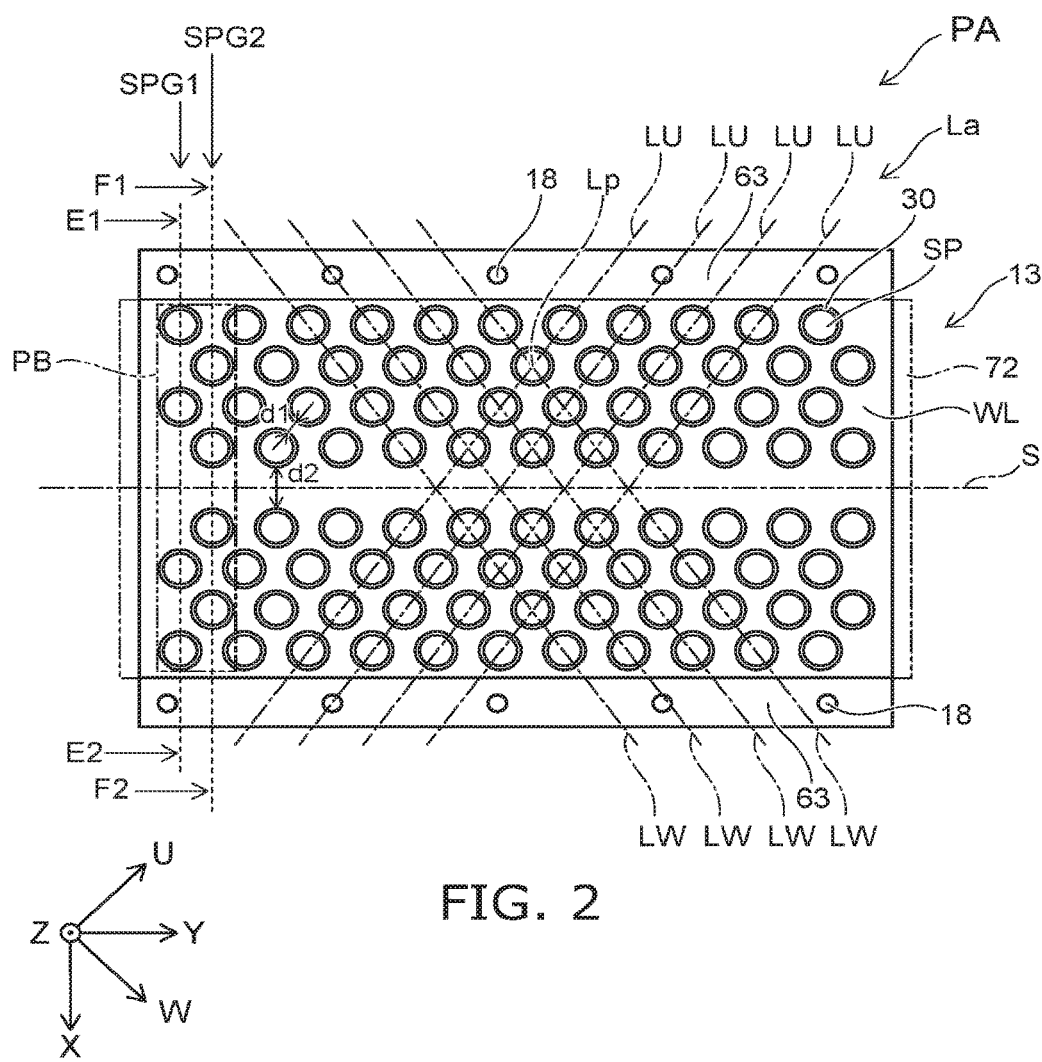
FIG. 2 is a sectional view illustrating a portion of the semiconductor memory device according to the embodiment.

FIG. 2 is a sectional view illustrating a portion of the semiconductor memory device according to the embodiment.

FIG. 2 shows a PA sectional portion of FIG. 1. As shown in FIG. 2, in the portion PA, a plurality of columnar structures SP is provided in the stacked body 13. Each of the columnar structures SP extends in the Z-direction and includes a silicon layer as a semiconductor layer. As viewed from the Z-direction, the centers of the plurality of columnar structures SP are disposed at lattice points Lp of a lattice La. The lattice La is configured of a plurality of imaginary straight lines LU extending in a U-direction and arranged at equal intervals and a plurality of imaginary straight lines LW extending in a W-direction and arranged at equal intervals. The U-direction is inclined with respect to the X-direction and the Y-direction; the W-direction is also inclined with respect to the X-direction and the Y-direction; and the U-direction and the W-direction cross each other. An angle made by the U-direction and the W-direction may be arbitrary, and may be 90 degrees or may not be 90 degrees. However, in the lattice points Lp, at the lattice points Lp located in a central plane S of the stacked body 13 in the X-direction, the columnar structure SP is not disposed. The central plane S is a YZ plane. For this reason, the lattice points Lp at which the columnar structures SP are not disposed are arranged along the Y-direction in the central plane S.

A plurality of columnar structures SP arranged in one row along the X-direction is referred to as a columnar structure group SPG1 (first line columnar structures). A plurality of columnar structures SP arranged in one row along the X-direction, which is a group different from the columnar structure group SPG1, is referred to as a columnar structure group SPG2 (second line columnar structures).

Figure 3:
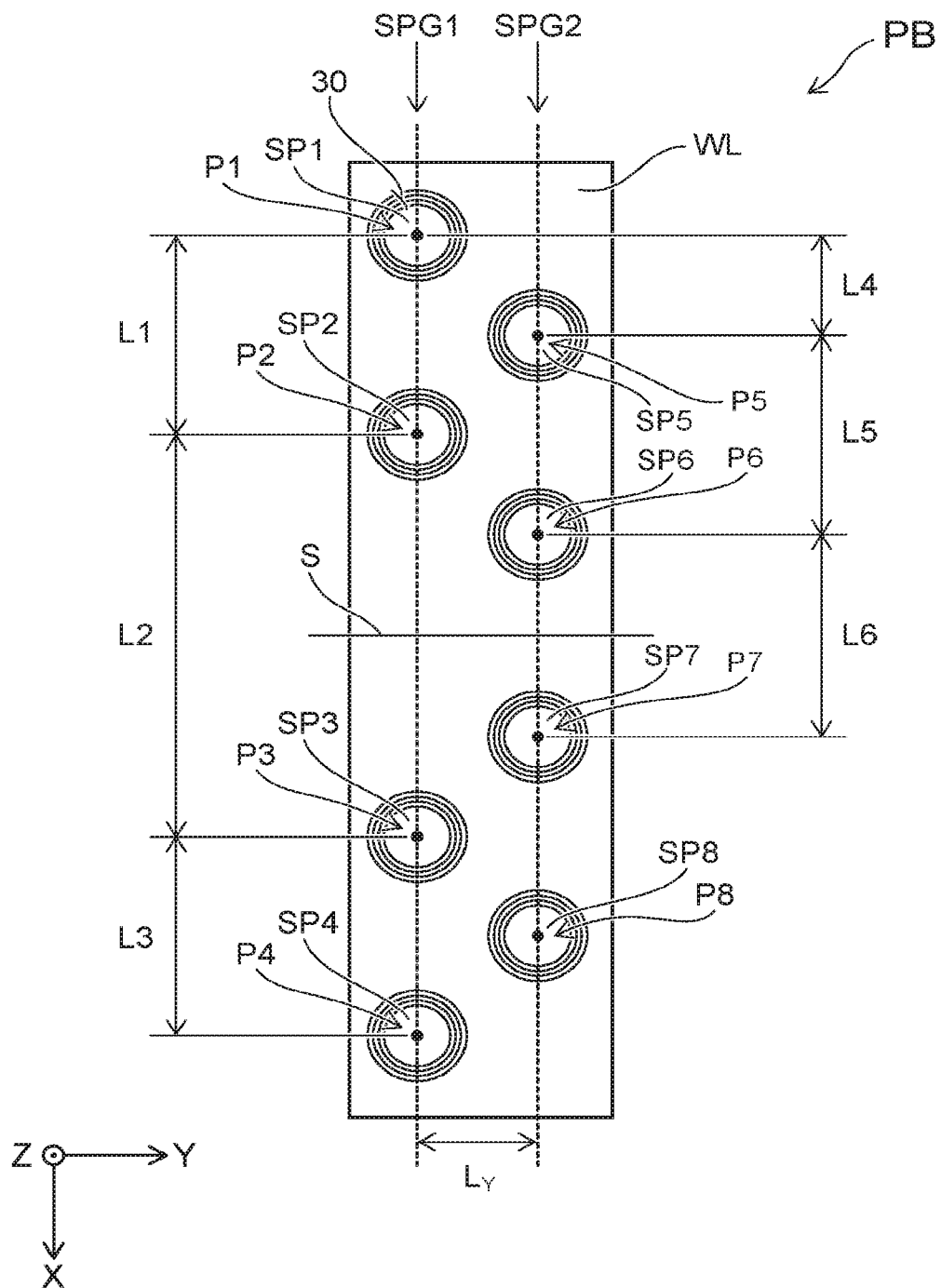
FIG. 3 is a sectional view illustrating a portion of the semiconductor memory device according to the embodiment.

FIG. 3 is a sectional view illustrating a portion of the semiconductor memory device according to the embodiment.

FIG. 3 shows a portion of FIG. 2. As shown in FIG. 3, in the columnar structure group SPG1, a columnar structure SP1 (first columnar structure) to a columnar structure SP4 (fourth columnar structure) are arranged in this order along the X-direction.

A distance between a center P1 of the columnar structure SP1 and a center P2 of the columnar structure SP2 is defined as a center-to-center distance L1. A distance between the center P2 of the columnar structure SP2 and a center P3 of the columnar structure SP3 is defined as a center-to-center distance L2. A distance between the center P3 of the columnar structure SP3 and a center P4 of the columnar structure SP4 is defined as a center-to-center distance L3. The center-to-center distance L1 is shorter than the center-to-center distance L2. The center-to-center distance L3 is shorter than the center-to-center distance L2. In the columnar structure group SPG1, the columnar structure SP is not provided at the central portion including the central plane S.

In the columnar structure group SPG2, for example, a columnar structure SP5 (fifth columnar structure) to a columnar structure SP8 (eighth columnar structure) are arranged in this order along the X-direction.

The position of the columnar structure SP in the X-direction in the columnar structure group SPG1 and the position of the columnar structure SP in the X-direction in the columnar structure group SPG2 are different. For example, the position of the columnar structure SP1 in the X-direction and the position of the columnar structure SP5 in the X-direction are different. Hence, the position of a center P of the columnar structure SP in the X-direction in the columnar structure group SPG1 and the position of a center P of the columnar structure SP in the X-direction in the columnar structure group SPG2 are different.

The position of the columnar structure SP5 in the X-direction is located between the position of the columnar structure SP1 in the X-direction and the position of the columnar structure SP2 in the X-direction. The position of the columnar structure SP6 in the X-direction is located between the position of the columnar structure SP2 in the X-direction and the position of the columnar structure SP3 in the X-direction. The position of the columnar structure SP7 in the X-direction is located between the position of the columnar structure SP2 in the X-direction and the position of the columnar structure SP3 in the X-direction. The position of the columnar structure SP8 in the X-direction is located between the position of the columnar structure SP3 in the X-direction and the position of the columnar structure SP4 in the X-direction.

A center-to-center distance L4 in the X-direction between the center P1 of the columnar structure SP1 and a center P5 of the columnar structure SP5 is shorter than a center-to-center distance L5 between the center P5 and a center P6 of the columnar structure SP6 and a center-to-center distance L6 between the center P6 and a center P7 of the columnar structure SP7.

The position of the center P5 in the X-direction is shifted by the center-to-center distance L4 in the X-direction compared with the position of the center P1 in the X-direction.

The center-to-center distances L1, L3, L5, and L6 are substantially equal to each other in the X-direction. The center-to-center distance L2 is about twice the center-to-center distance L1, and the center-to-center distance L4 is about half the center-to-center distance L1.

The columnar structures SP are disposed on both sides in the X-direction as viewed from the insulating film 37. Then, a shortest distance d1 between the columnar structures SP is shorter than a shortest distance d2 between the columnar structures SP that are disposed with the insulating film 37 interposed therebetween.

Figure 4:
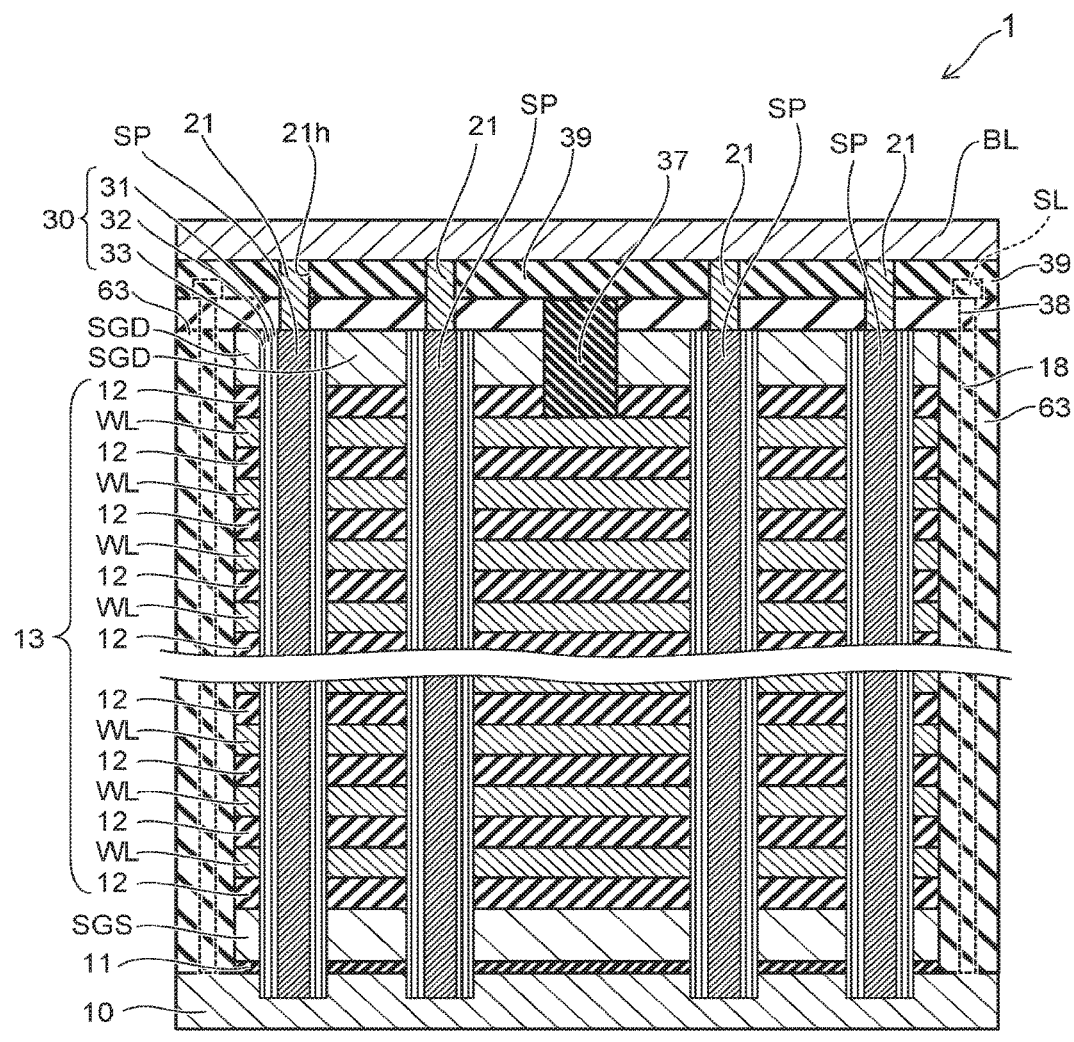
FIG. 4 is a schematic sectional view along the line E1-E2 shown in FIG. 2.

FIG. 4 is a schematic sectional view along the line E1-E2 shown in FIG. 2.

Figure 5:
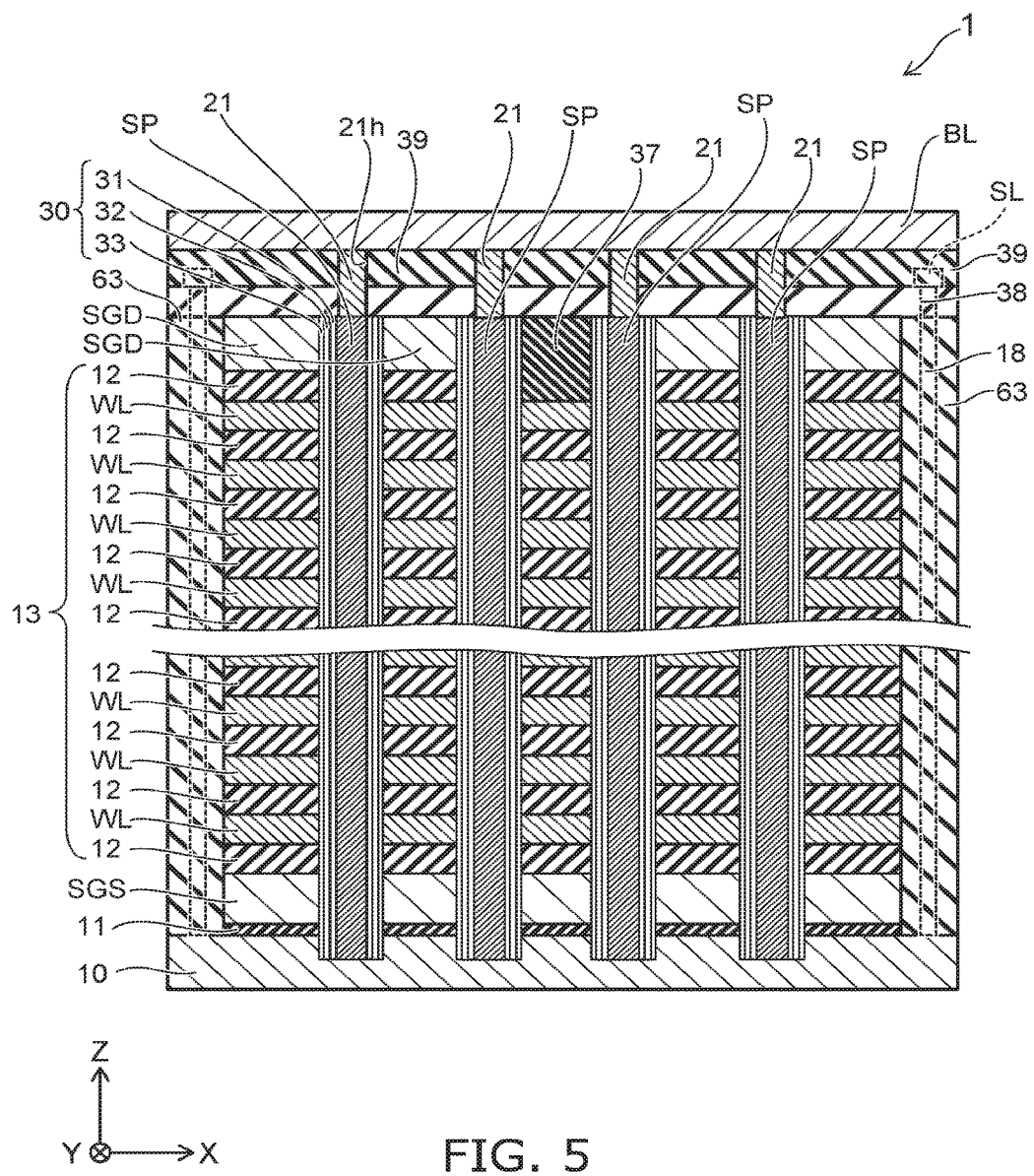
FIG. 5 is a schematic sectional view along the line F1-F2 shown in FIG. 2.

FIG. 5 is a schematic sectional view along the line F1-F2 shown in FIG. 2.

As shown in FIG. 4 and FIG. 5, a plurality of insulating members 63 is provided on the silicon substrate 10. Each of the insulating members 63 spreads along a YZ plane from the silicon substrate 10 to the drain-side select gate electrode SGD. Between two insulating members 63 adjacent to each other, the plurality of columnar structures SP is provided.

Each of the plurality of columnar structures SP pierces from the drain-side select gate electrode SGD to the interior of the silicon substrate 10 in the Z-direction. As described above, a silicon layer as a semiconductor layer is provided in the columnar structure SP. The shape of the silicon layer may be a circular cylinder shape in which silicon is filled into the interior thereof, or may be a circular tubular shape with the central axis extending in the Z-direction. When the shape of the silicon layer is a circular tubular shape, an insulating core member made of, for example, silicon oxide may be provided in the columnar structure SP.

A tunnel insulating film 31 is provided on a side surface of the columnar structure SP. A charge storage film 32 is provided on a side surface of the tunnel insulating film 31. A block insulating film 33 is provided between the charge storage film 32 and the stacked body 13. A stacked film formed of the tunnel insulating film 31, the charge storage film 32, and the block insulating film 33 is referred to as a memory film 30.

The block insulating film 33 is a film that does not substantially allow a current to flow even when a voltage is applied within the range of a drive voltage of the semiconductor memory device 1. The charge storage film 32 is a film capable of storing electrical charges. The tunnel insulating film 31 is a film that is normally insulating but allows a tunnel current to flow when a predetermined voltage within the range of the drive voltage of the semiconductor memory device 1 is applied. At a crossing portion between the columnar structure SP and the word line WL, a memory cell is formed of the columnar structure SP, the memory film 30, and the word line WL.

A contact 21 extending in the Z-direction is provided on the columnar structure SP, and a plurality of bit lines BL extending in the X-direction and separated in the Y-direction is provided on the contact 21. The columnar structure SP is connected to the bit line BL via the contact 21.

An insulating film 38 is provided on the drain-side select gate electrode SGD and the insulating member 63. A contact 18 piercing the insulating film 38 and the insulating member 63 in the Z-direction is provided on the silicon substrate 10. The contact 18 is connected to the silicon substrate 10. A source line SL extending in the Y-direction is provided on the contact 18 and connected to the contact 18.

The silicon substrate 10 is formed of, for example, a semiconductor material containing silicon (Si). An impurity is introduced into an upper layer portion of the silicon substrate 10, so that the upper layer portion is conductive. The insulating film 11 and the insulating film 12 are formed of, for example, an insulating material such as silicon oxide ($SiO_2$). The contact 18, the contact 21, the word line WL, the source line SL, and the bit line BL are formed of, for example, a conductive material such as tungsten (W) or polysilicon. The block insulating film 33 is formed of, for example, silicon oxide, metal oxide, or the like. The charge storage film 32 is formed of, for example, an insulating material such as silicon nitride ($Si_3N_4$). Note that the charge storage film 32 may be formed of a conductive material such as polysilicon. In this case, the charge storage film 32 functions as a floating gate electrode. The tunnel insulating film 31 is formed of, for example, silicon oxide. The columnar structure SP is formed of, for example, a semiconductor material containing silicon.

A method for manufacturing the semiconductor memory device according to the embodiment will be described.

FIG. 6A to FIG. 20B are sectional views illustrating the method for manufacturing the semiconductor memory device according to the embodiment. Note that FIG. 6A is a sectional view along the line F1-F2 in FIG. 2, and that FIG. 6B is a sectional view along the line E1-E2 in FIG. 2. The same applies to FIG. 7A to FIG. 20B.

As shown in FIG. 6A and FIG. 6B, the insulating film 11 made of, for example, $SiO_2$ is formed on the silicon substrate 10. Further, the insulating films 12 and sacrifice films 70 are alternately stacked to form the stacked body 13. The insulating film 12 is formed of, for example, silicon oxide. The sacrifice film 70 is formed of a material with which etching selectivity is obtained between the insulating film 12 and the sacrifice film 70, for example, silicon nitride.

Next, for example, amorphous silicon is deposited to form a hard mask 49 on the stacked body 13. Silicon oxide is deposited by, for example, a CVD method using TEOS (Tetra Ethyl Ortho Silicate: $Si(OC_2H_5)_4$) as a raw material to form an insulating film 50 (TEOS film 50) on the hard mask 49. A carbon-containing film 51 is formed on the insulating film 50 by, for example, a coating method. An SOG (Spin On Glass) film 52 is formed on the carbon-containing film 51. A resist film 53 is formed on the SOG film 52.

Next, the resist film 53 is exposed using a multipole light source. At this time, for example, by disposing openings of an exposure mask (not shown) at positions at which the intensity of light has a local maximum value due to interference of diffracted waves, exposure with high accuracy can be performed. Specifically, as shown in FIG. 2, the openings of the exposure mask are aligned with the lattice points Lp of the lattice La configured of the plurality of imaginary straight lines LU extending in the U-direction and arranged at equal intervals and the plurality of imaginary straight lines LW extending in the W-direction and arranged at equal intervals. Next, the resist film 53 is developed. Due to this, openings are formed in areas each centered on the lattice point Lp in the resist film 53. In this manner, the resist film 53 is patterned, and memory holes MH and dummy holes DMY are formed. Note that the memory holes MH are arranged in a staggered manner, and that the dummy holes DMY are arranged in one row along the Y-direction.

Next, as shown in FIG. 7A and FIG. 7B, etching is performed using the resist film 53 as a mask. Due to this, the carbon-containing film 51 and the TEOS film 50 are patterned.

Figures 8A, 8B:
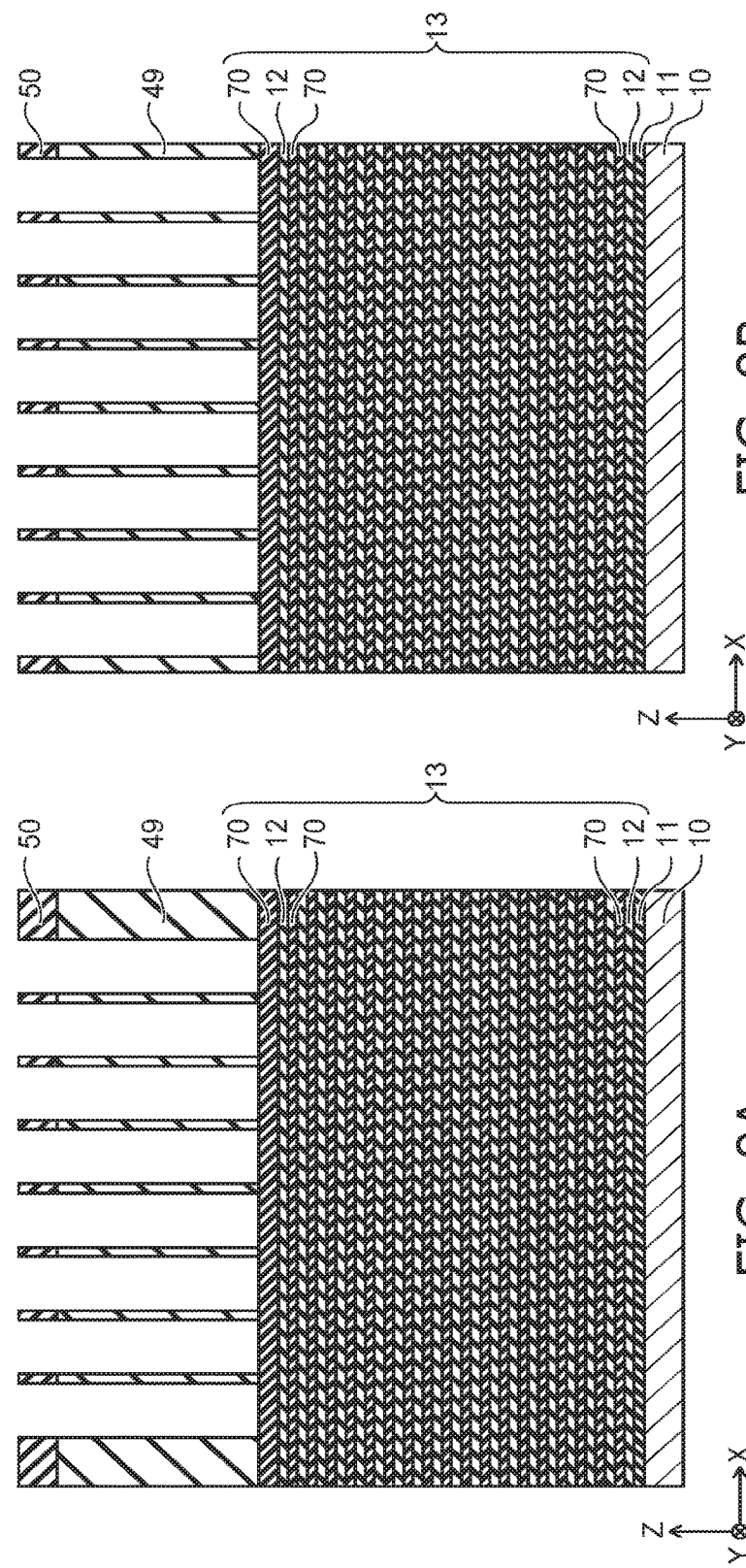

Next, as shown in FIG. 8A and FIG. 8B, the hard mask 49 is patterned by performing etching using the carbon-containing film 51 and the TEOS film 50 as a mask. In this manner, a first mask pattern made of the hard mask 49 is formed on the stacked body 13.

As shown in FIG. 9A and FIG. 9B, a resist film 54 is formed on the entire surface and embedded in the etched portions in the TEOS film 50 and the hard mask 49.

Next, as shown in FIG. 10A and FIG. 10B, the resist film 54 is etched back to expose an upper portion of the TEOS film 50. Next, the TEOS film 50 and the resist film 54 are covered by forming an SOG film 55 on the entire surface and planarizing an upper surface. Next, a resist film 56 is formed on the SOG film 55. Next, the resist film 56 is exposed and developed, and the resist film 56 is patterned so as to cover the dummy hole DMY but not to cover the memory hole MH.

Figure 11B:
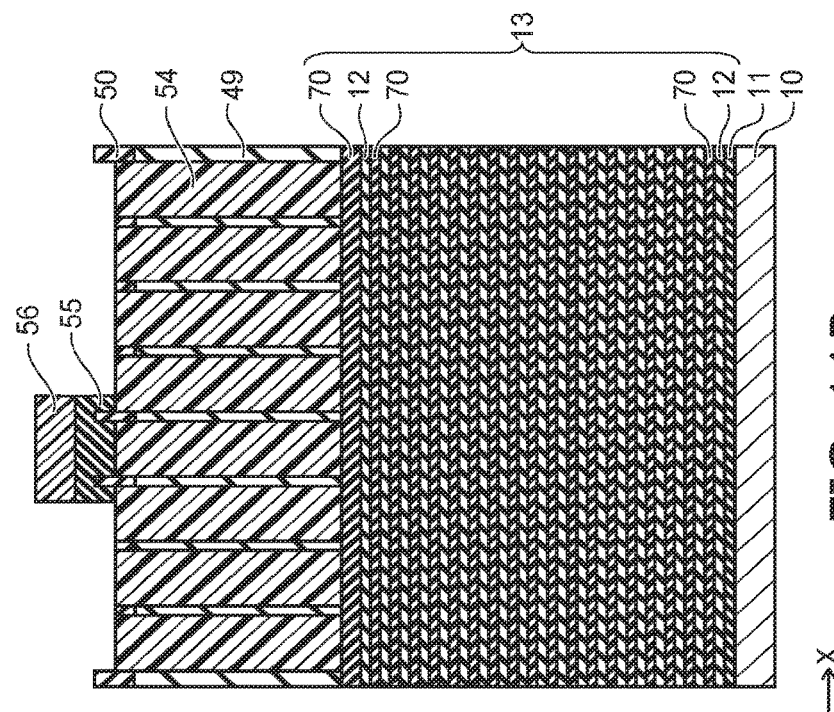
Figure 11A:
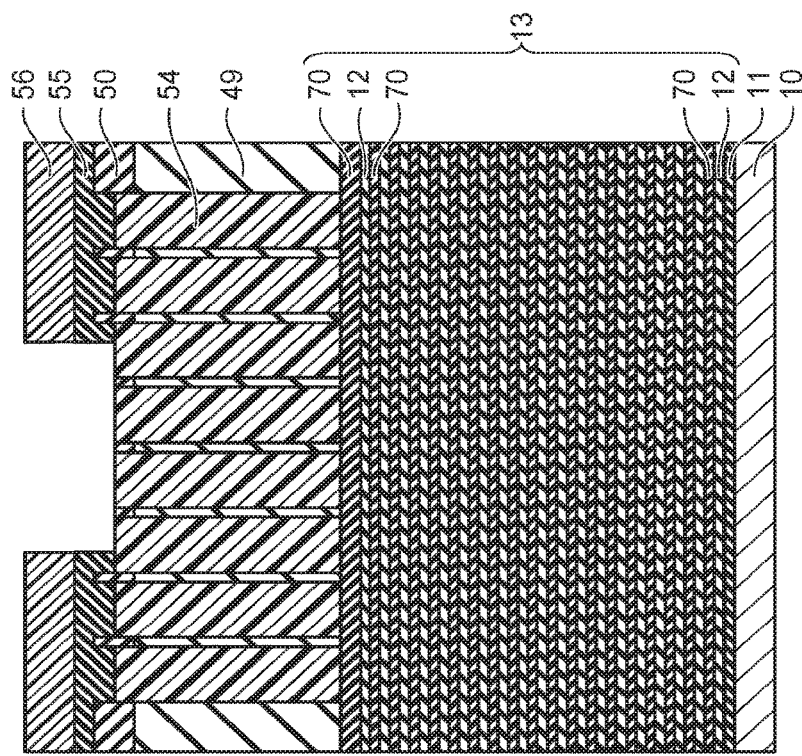

Next, as shown in FIG. 11A and FIG. 11B, by performing RIE (Reactive Ion Etching) using the resist film 56 as a mask, the SOG film 55 is removed in an area where the memory hole MH is formed, and a portion protruded from an upper surface of the hard mask 49 in the TEOS film 50 is removed. Due to this, the resist film 54 embedded in the memory hole MH is exposed.

Figures 12A, 12B:
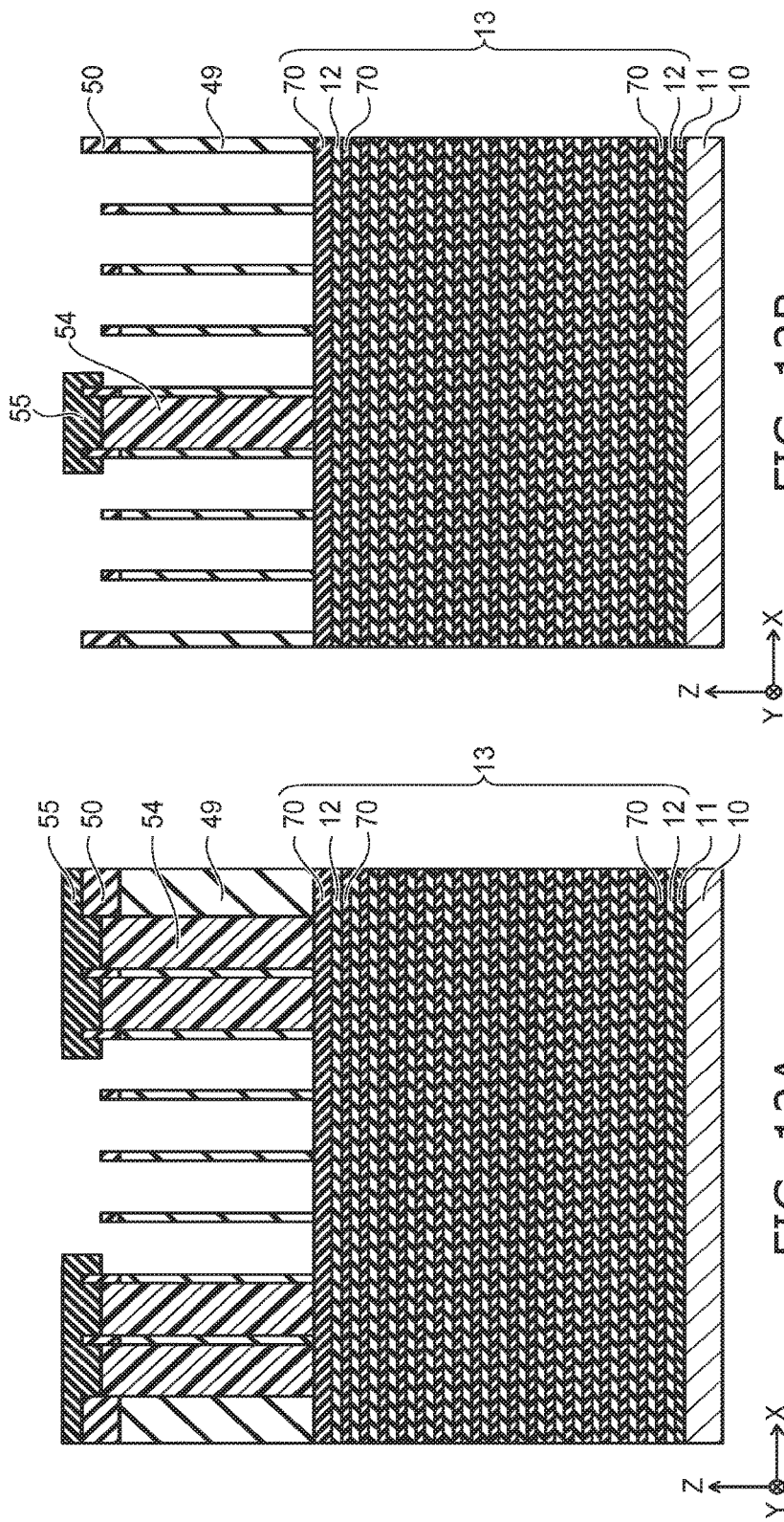

Next, as shown in FIG. 12A and FIG. 12B, the resist film 54 is removed from within the memory hole MH by ashing or the like.

Figure 13B:
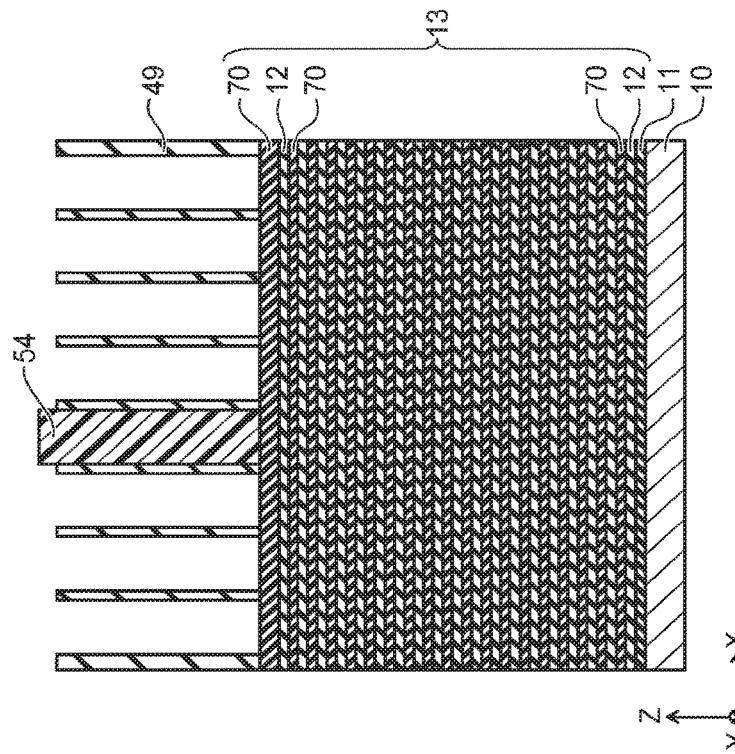
Figure 13A:
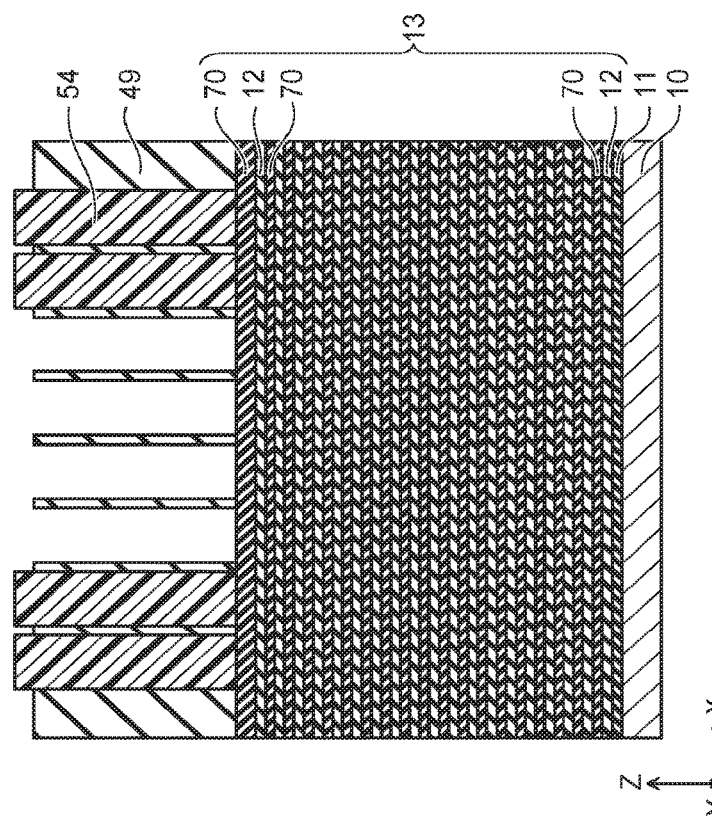

Next, as shown in FIG. 13A and FIG. 13B, the SOG film 55 and the TEOS film 50 are removed using a wet process or a dry process such as RIE. In this manner, a second mask pattern made of the resist film 54 is formed.

Figure 14B:
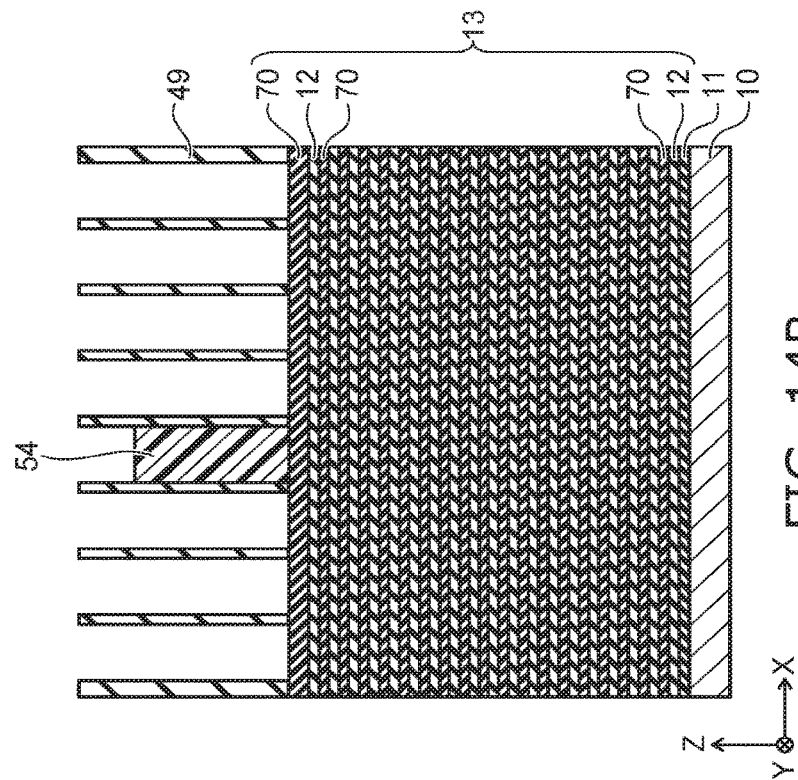
Figure 14A:
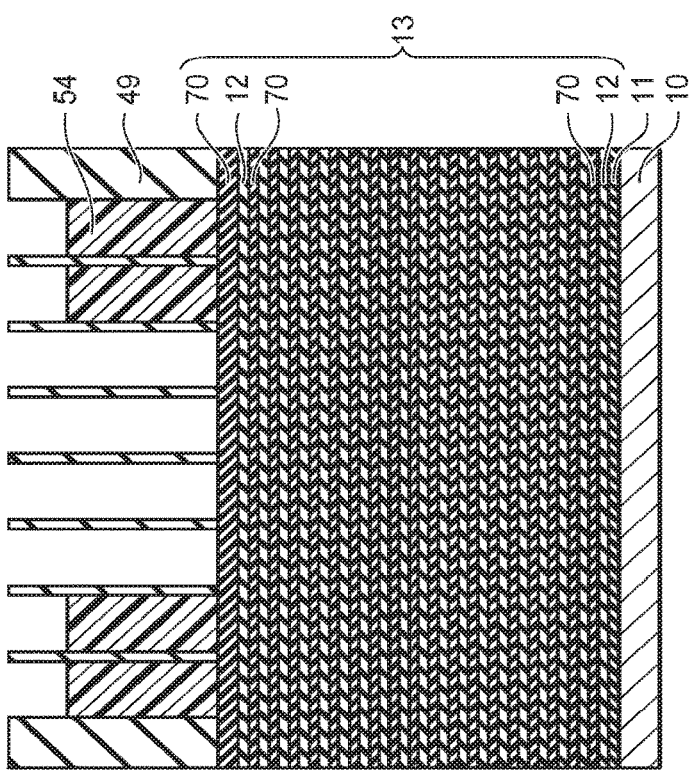
Figure 15B:
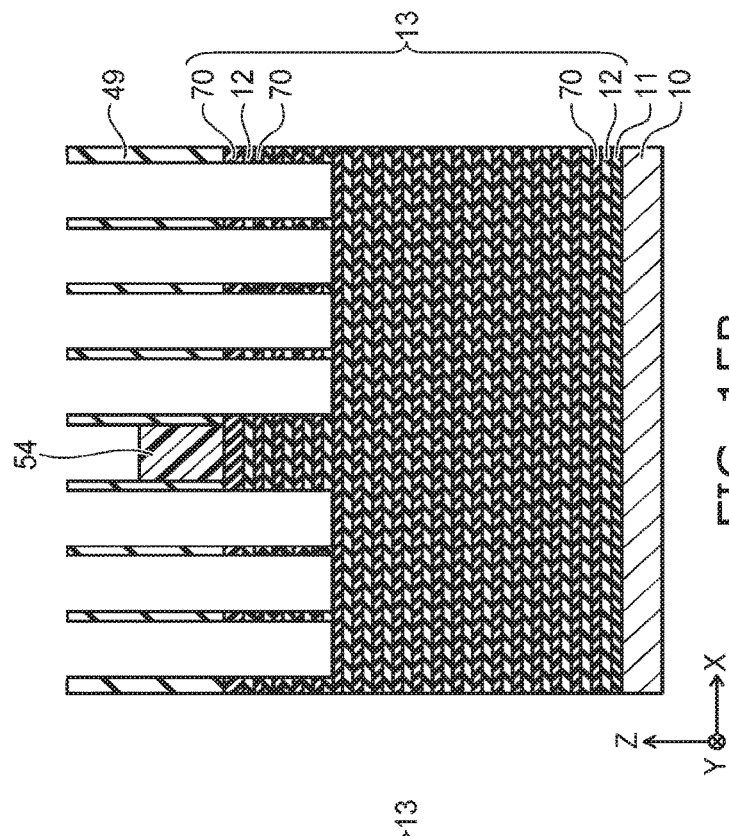
Figure 15A:
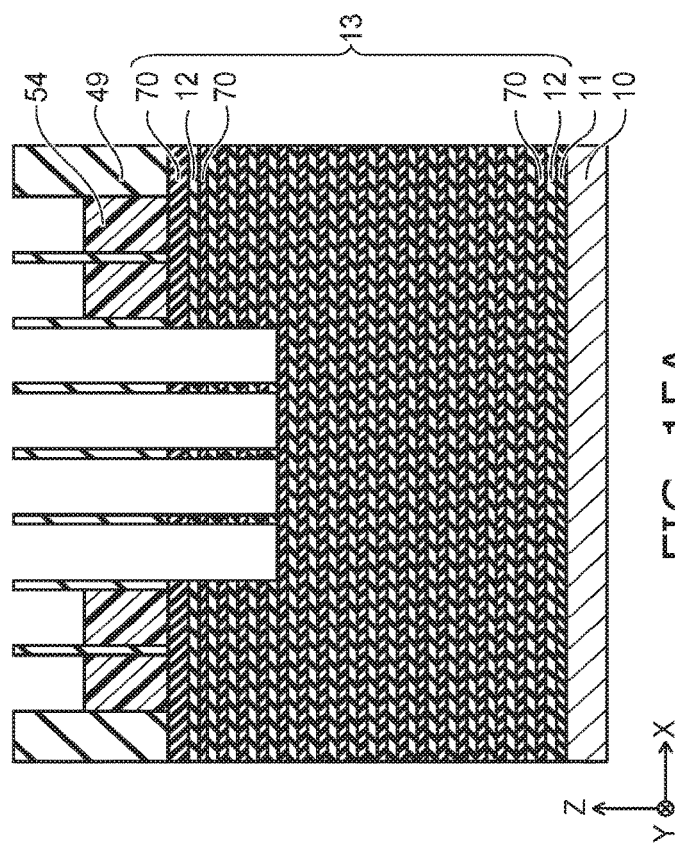
Figure 16A:
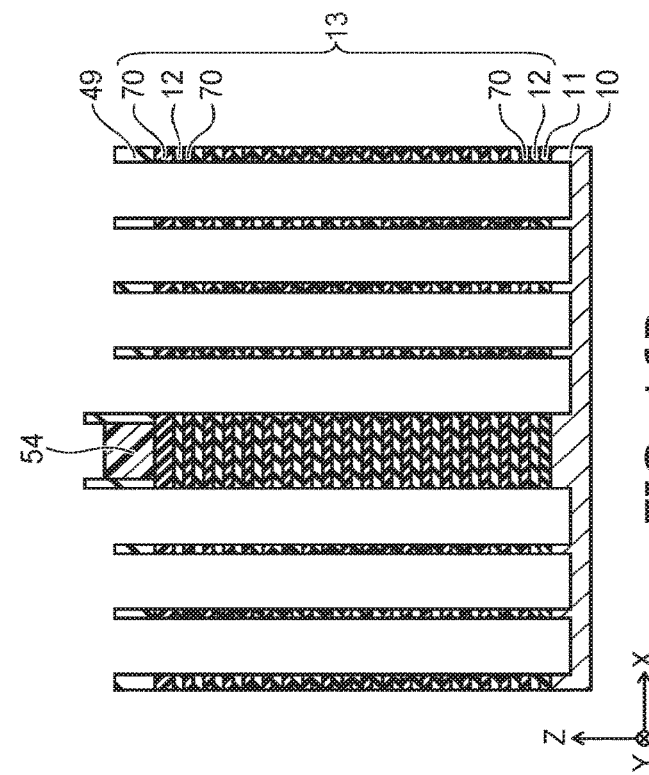
Figure 16B:
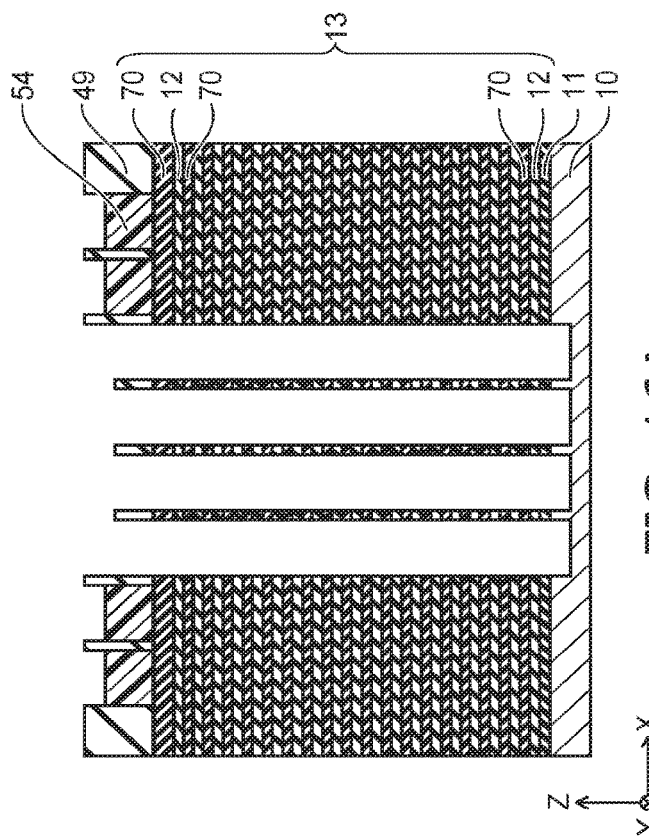

Next, as shown in FIG. 14A and FIG. 14B, the resist film 54 is dropped to approximately the middle. By processing the stacked body 13 in this state by RIE or the like, the memory hole MH is processed to the final depth as shown in FIG. 16A and FIG. 16B, through a processing middle state shown in FIG. 15A and FIG. 15B, and thus the memory hole MH is opened in the stacked body 13.

Next, as shown in FIG. 17A and FIG. 17B, a resist film 57 is embedded entirely. At this time, the resist film 57 is also embedded in the memory hole MH.

Next, as shown in FIG. 18A and FIG. 18B, etch-back of the resist film 57 is performed to remove the resist film 57 from an upper portion in the memory hole MH and remove the resist film 57 from an area other than the memory hole MH. However, in the memory hole MH, the resist film 57 is left in a portion other than the upper portion.

Figure 19B:
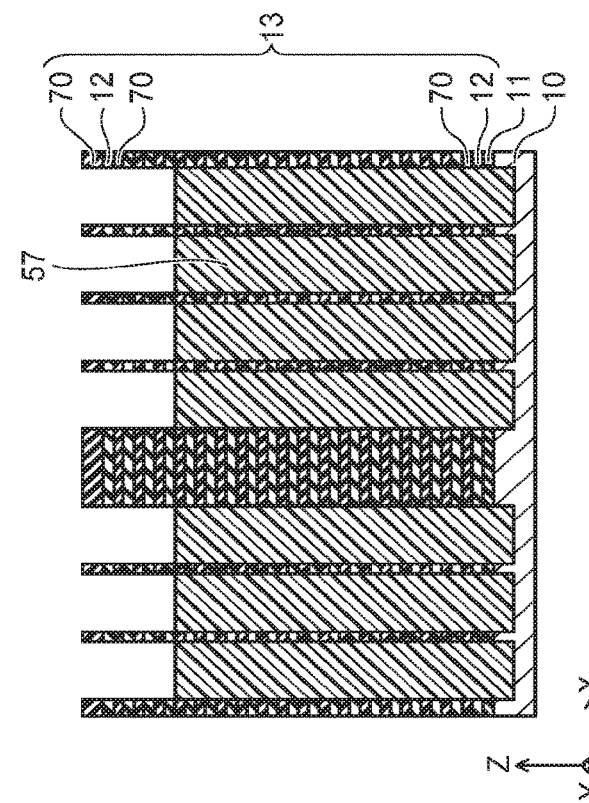
Figure 19A:
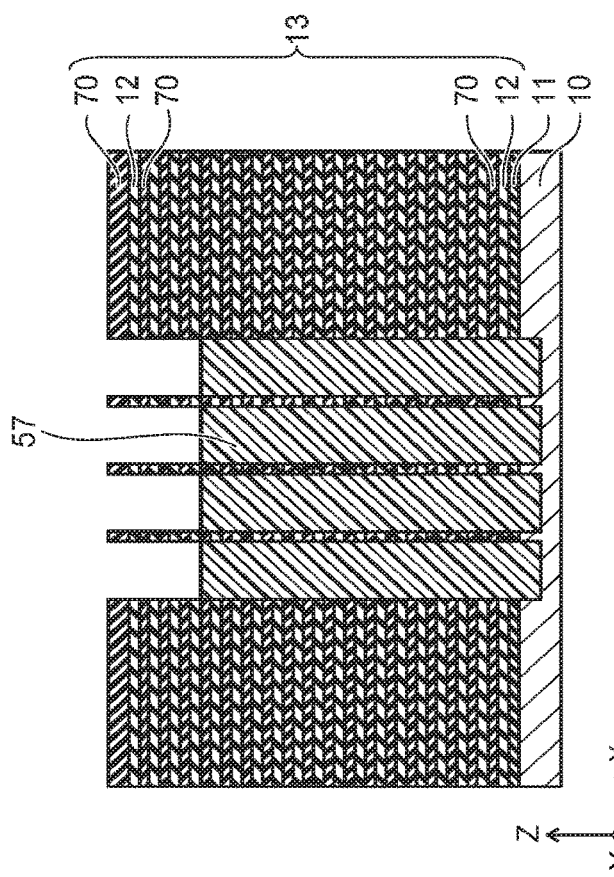

Next, as shown in FIG. 19A and FIG. 19B, the hard mask 49 is removed by, for example, dry etching.

Figure 20A:
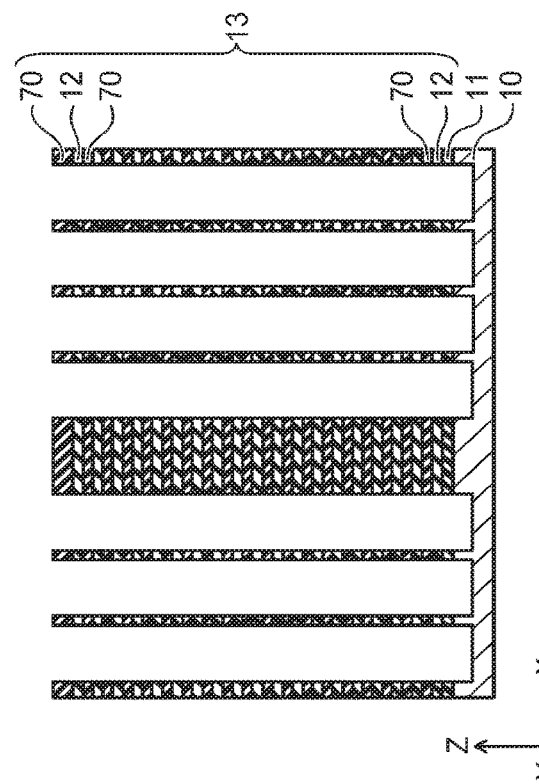
Figure 20B:
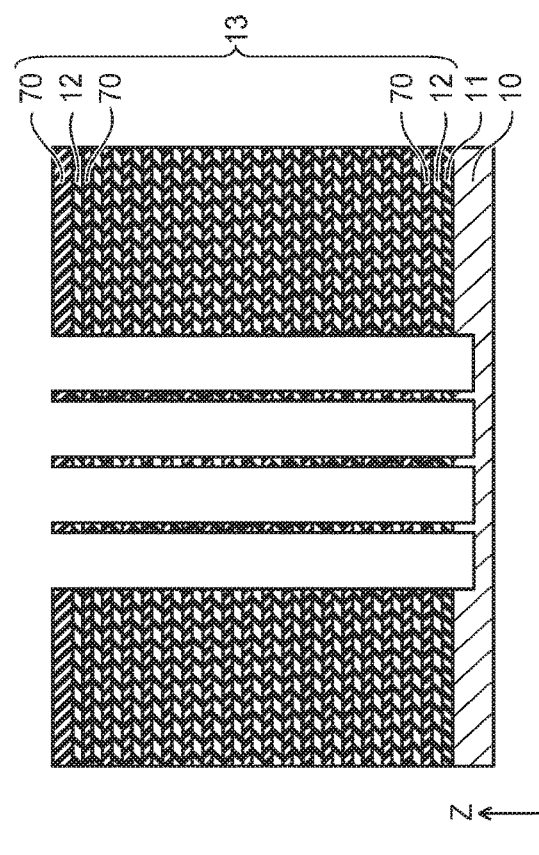

Next, as shown in FIG. 20A and FIG. 20B, the resist film 57 is removed. Due to this, it is possible to form only the memory hole in the stacked body 13 and not to form the dummy hole DMY. In this manner, when the regularity of openings is different between the E1-E2 cross-section and the F1-F2 cross-section, the memory hole MH pattern can be opened at desired positions by the continuous process.

A process after this is the same as the manufacturing process of a general three-dimensional stacked memory, and therefore will be described very briefly. Note that manufacturing process elements described below do not necessarily limit the manufacturing method of the patent, and that various manufacturing processes after opening memory holes are applicable.

That is, as shown in FIG. 4 and FIG. 5, the memory film 30 is formed by depositing the block insulating film 33, the charge storage film 32, and the tunnel insulating film 31 in this order on an inner surface of the memory hole MH. Next, a silicon cover layer is formed on a surface of the memory film 30, and the silicon cover layer and the memory film 30 are removed from a bottom surface of the memory hole MH to expose the silicon substrate 10. Next, a body silicon is deposited. The columnar structure SP is formed of the silicon cover layer and the body silicon. A lower end of the columnar structure SP is connected to the silicon substrate 10.

Next, portions including the central plane S in the insulating film 12 at the uppermost stages in the stacked body 13 are removed to form a trench extending in the Y-direction. Then, the insulating film 37 is embedded in this trench. Due to this, the sacrifice films 70 at the uppermost stages are divided at each of the central planes S.

Next, slits are formed in areas where a source hole SH is set in the stacked body 13. A line-shaped portion extending in the Y-direction is included in the slit. The slit is caused to reach the silicon substrate 10. Due to this, the stacked body 13 is divided by the slits.

Next, the sacrifice films 70 are removed by performing wet etching through the slits. Then, by depositing a conductive material such as tungsten through the slits, the conductive material is embedded in spaces after the removal of the sacrifice films 70. Next, the conductive material deposited in the slit is removed by performing etching. Due to this, an electrode film is formed in each of the spaces after the removal of the sacrifice films 70. At this time, the electrode film in an upper stage portion in the stacked body 13 serves as the drain-side select gate electrode SGD, the electrode film in a lower stage portion serves as the source-side select gate electrode SGS, and the electrode films other than those serve as the word lines WL. Note that the drain-side select gate electrode SGD and the source-side select gate electrode SGS may be each formed by connecting the electrode films at plural stages to each other.

Next, the insulating member 63 is embedded in the slit. Next, the contact 18 is formed in the insulating member 63. A lower end of the contact 18 is caused to reach the silicon substrate 10. Next, an insulating film 39 is formed on the insulating film 38. Next, the source line SL extending in the Y-direction is formed in the insulating film 39 and connected to an upper end of the contact 18. Moreover, the contact 21 is formed so as to pierce the insulating film 39 and the insulating film 38, and is connected to an upper end of the columnar structure SP. Next, the bit line BL extending in the X-direction is formed on the insulating film 39 and connected to the contact 21.

Due to this, the semiconductor memory device 1 is formed.

Next, an operational advantage of the embodiment will be described.

As shown in FIG. 2, in the semiconductor memory device 1, a finger area 72 is provided. The finger area 72 is an area formed of the word line WL and the plurality of columnar structures SP provided between two insulating members 63. As shown in FIG. 3, a distance in the X-direction between the centers P of two columnar structures SP is defined as a center-to-center distance $L_X$. The center-to-center distance $L_X$ is equal to the distances L1 and L3. A distance in the Y-direction between the centers P of two columnar structures SP is defined as a center-to-center distance L. In one finger area 72, the resistance of the word line WL is defined as a resistance $R_{WL}$. In one finger area 72, a capacitance between the word line WL and each of other word lines WL that are vertically separated from the word line WL in the Z-direction is defined as a capacitance $C_{WL}$. A capacitance between the word line WL and the contact 18 is defined as a capacitance $C_{WLLI}$. Further, a capacitance between the word line WL and the columnar structure SP is defined as a capacitance $C_{WS}$. The total capacitance of the capacitance $C_{WL}$, the capacitance $C_{WLLI}$, and the capacitance $C_{WS}$ is defined as a capacitance C. In one finger area 72, the time constant of the word line WL is defined as a time constant τ.

FIG. 21A to FIG. 23 are graphs illustrating characteristics of the semiconductor memory device.

Figure 21A:
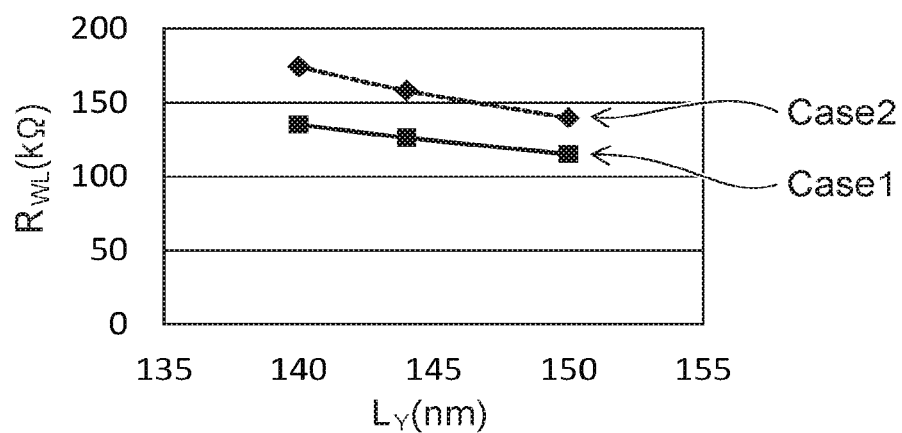
FIG. 21A to FIG. 23 are graphs illustrating characteristics of the semiconductor memory device.

FIG. 21A is an example of a simulation result of the relationship between the resistance $R_{WL}$ of the word line WL and the center-to-center distance $L_Y$ between the columnar structures SP. The horizontal axis of FIG. 21A is the center-to-center distance L. In FIG. 21A, two cases, "Case1" and "Case2", are shown. In "Case1", the number of the columnar structures SP in the columnar structure group SPG1 is four, and the columnar structure SP is not provided at a central portion in the X-direction. "Case1" corresponds to one example of the embodiment. In "Case2", the number of the columnar structures SP in the columnar structure group SPG1 is five, and the columnar structure SP is provided at the central portion in the X-direction. However, this structure of Case2 is not included in the embodiment and not shown in the drawings.

Figure 21B:
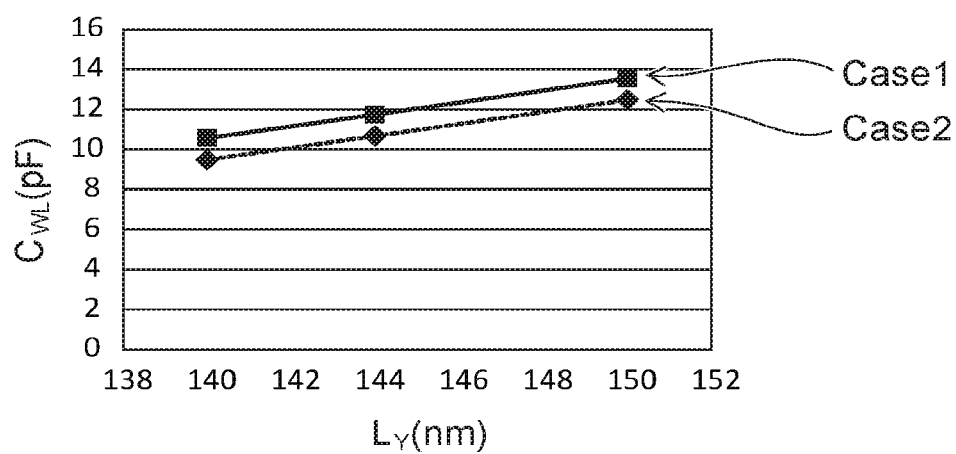

FIG. 21B is an example of a simulation result of the relationship between the capacitance $C_{WL}$ and the center-to-center distance $L_Y$ between the columnar structures SP. The horizontal axis of FIG. 21B is the center-to-center distance $L_Y$. The vertical axis of FIG. 21B is the capacitance $C_{WL}$.

Figure 22A:
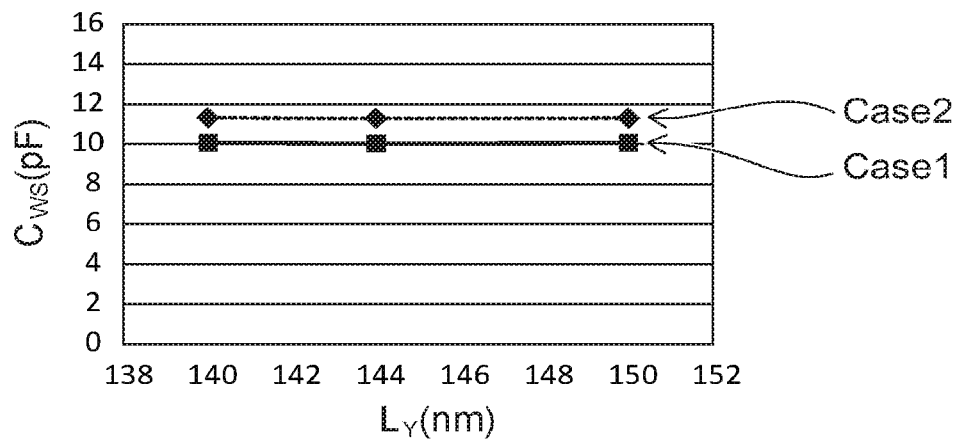

FIG. 22A is an example of a simulation result of the relationship between the capacitance $C_{WS}$ between the word line WL and the columnar structure SP and the center-to-center distance $L_Y$ between the columnar structures SP. The horizontal axis of FIG. 22A is the center-to-center distance $L_Y$. The vertical axis of FIG. 22A is the capacitance $C_{WS}$.

Figure 22B:
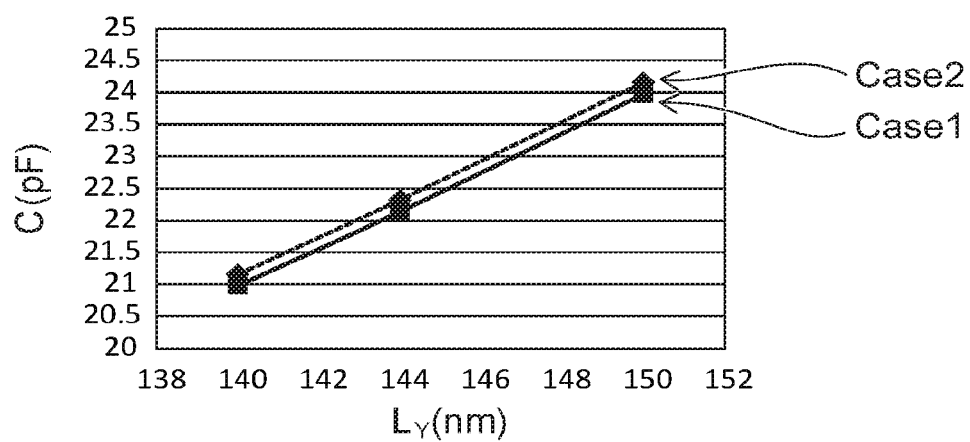

FIG. 22B is an example of a simulation result of the relationship between the capacitance C and the center-to-center distance $L_Y$ between the columnar structures SP. The horizontal axis of FIG. 22B is the center-to-center distance $L_Y$. The vertical axis of FIG. 22B is the capacitance C.

Figure 23:
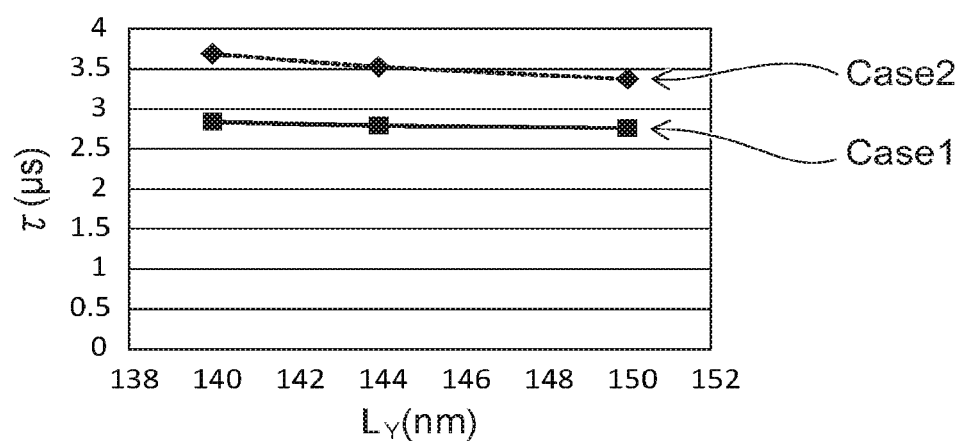

FIG. 23 is an example of a simulation result of the relationship between the time constant τ and the center-to-center distance $L_Y$ between the columnar structures SR The horizontal axis of FIG. 23 is the center-to-center distance $L_Y$. The vertical axis of FIG. 23 is the time constant τ of the word line WL.

As shown in FIG. 21A, in "Case1" and "Case2", when the center-to-center distance $L_Y$ is large, the resistance $R_{WL}$ becomes small. The reason for this is that since the value of the diameter of the columnar structure SP is a fixed value in the simulation, the volume occupied by the conductive word line WL becomes large in the finger area 72 when the center-to-center distance $L_Y$ is large. The resistance $R_{WL2}$ of "Case2" becomes larger than the resistance $R_{WL1}$ of "Case1". The reason for this is that, in "Case2", since the columnar structure SP is provided at the central portion in the X-direction of the finger area 72, the volume of the conductive word line WL in the finger area 72 is reduced by an amount corresponding to the volume of the columnar structure SP.

As shown in FIG. 21B, in "Case1" and "Case2", when the center-to-center distance $L_Y$ is large, the capacitance $C_{WL}$ becomes large. The reason for this is that when the center-to-center distance $L_Y$ is large, the effective area of the word line WL in an XY plane in the finger area 72 increases in the simulation on the above-described condition that the diameter of the columnar structure SP is constant, and the area of a parallel flat-plate capacitor formed of the word lines WL increases. A capacitance $C_{WL2}$ of the word line WL of "Case2" becomes smaller than a capacitance $C_{WL1}$ of the word line WL of "Case1". The reason for this is that, in "Case2", the columnar structure SP is provided at the central portion in the X-direction of the finger area 72, and thus the area of the parallel flat-plate capacitor formed of the word line WL and the word line WL that is separated from the word line WL in the Z-direction becomes small by an amount corresponding to the cross-sectional area of the columnar structure SP in the XY plane.

As shown in FIG. 22A, a capacitance $C_{WS2}$ of "Case2" becomes larger than a capacitance $C_{WS1}$ of "Case1". The reason for this is that, in "Case2", a capacitance is generated between the columnar structure SP at the central portion in the X-direction of the finger area 72, which is additionally formed in the columnar structure group SPG1, and the word line WL.

As shown in FIG. 22B, the capacitance C that is the total capacitance of the capacitance $C_{WL}$ and the capacitances $C_{WS}$, $C_{WLLI}$ of "Case1" is smaller than the capacitance C that is the total capacitance of "Case2".

The relationship among the time constant τ, the capacitance C, and the resistance R is shown by the following mathematical formula 1.

$$\tau = C \times R \quad (1)$$

The resistance $R_{WL}$ of "Case1" is smaller than the resistance $R_{WL}$ of "Case2". The capacitance C that is the total capacitance of "Case1" is smaller than the capacitance C that is the total capacitance of "Case2". Accordingly, as shown in FIG. 23, the time constant $\tau_1$ of "Case1" becomes smaller than the time constant $\tau_2$ of "Case2". Due to this, in the embodiment, since the amount of delay caused by the time constant is small, it is possible to operate the memory cell at a high speed.

As a result, it is possible to provide a semiconductor memory device capable of operating a memory cell at a high speed and a method for manufacturing the semiconductor memory device.

Note that although the manufacturing method in which, after the insulating films 12 and the sacrifice films 70 are alternately stacked to form the stacked body 13, the sacrifice films 70 are replaced with the electrode films has been shown in the embodiment described above, the manufacturing method is not limited to this. For example, the insulating films 12 and the electrode films may be alternately stacked from the beginning to form the stacked body, and the memory hole and the like may be formed in the stacked body. In this case, the degree of difficulty of etching in forming the memory hole in the stacked body might be increased, but the total number of processes can be reduced.

According to the embodiments explained above, a semiconductor memory device and a method for manufacturing the semiconductor memory device capable of high-speed operation can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a stacked body including a plurality of electrode films stacked along a first direction and separated from each other;
   a plurality of columnar structures extending in the first direction, piercing the stacked body, and including a semiconductor layer;
   a charge storage portion provided between one of the columnar structures and one of the electrode films; and
   an insulating film dividing one of the electrode films disposed in an upper portion of the stacked body and not dividing other one of the electrode films disposed in a lower portion of the stacked body, wherein
   a shortest distance between the columnar structures disposed on one side of the insulating film being shorter than a shortest distance between the columnar structures disposed with the insulating film interposed between the columnar structures,
   the insulating film extends in a second direction crossing the first direction,
   as viewed from the first direction, the plurality of columnar structures is not disposed at first lattice points and is disposed at second lattice points except for the first lattice points, among lattice points of a lattice, the first lattice points being located in the insulating film and being arranged in a row along the second direction,
   the lattice being configured of a plurality of first imaginary straight lines and a plurality of second imaginary straight lines,
   the plurality of first imaginary straight lines extending in a third direction crossing the first direction and arranged at equal intervals, and
   the plurality of second imaginary straight lines extending in a fourth direction crossing the third direction and arranged at equal intervals.

2. The semiconductor memory device according to claim 1, further comprising insulating members disposed on both sides of the stacked body in a fifth direction, the fifth direction crossing the first direction and the second direction.

3. The semiconductor memory device according to claim 2, further comprising:
   a semiconductor substrate on which the stacked body is disposed; and
   a conductive member provided in the insulating member and extending in the first direction, a lower end of the conductive member being connected to the semiconductor substrate.

4. The semiconductor memory device according to claim 1, wherein the plurality of columnar structures is arranged along a plurality of rows extending in the second direction.

5. The semiconductor memory device according to claim 4, wherein the columnar structures are periodically arranged along the second direction in each of the rows.

6. The semiconductor memory device according to claim 5, wherein positions of the columnar structures in the second direction are shifted from each other in the rows adjacent to each other.

7. The semiconductor memory device according to claim 1, wherein the one of the electrode films disposed in the upper portion of the stacked body is thicker than the other one of the electrode films disposed in the lower portion of the stacked body.

8. The semiconductor memory device according to claim 1, wherein the charge storage portion is insulating.

9. The semiconductor memory device according to claim 1, wherein the charge storage portion is conductive.

10. The semiconductor memory device according to claim 1, further comprising:
    a tunnel insulating film disposed between the columnar structure and the charge storage portion; and
    a block insulating film disposed between the charge storage portion and the electrode films.

11. The semiconductor memory device according to claim 1, wherein an area, in the electrode films where the columnar structure is disposed that has not the columnar structure directly below the insulating film in the stacked body.

12. A semiconductor memory device comprising:
    a plurality of electrode films stacked along a first direction and separated from each other;

a plurality of columnar structures extending in the first direction and piercing the plurality of electrode films; and a charge storage portion provided between one of the plurality of columnar structures and one of the plurality of electrode films, wherein the plurality of columnar structures being not disposed at first lattice points arranged in a particular one row that exists periodically along a second direction and being disposed at second lattice points except for the first lattice points, as viewed from the first direction among lattice points of a lattice, the first lattice points being disposed on the electrode films, and the lattice being configured of a plurality of imaginary straight lines extending in a third direction and arranged at equal intervals and a plurality of imaginary straight lines extending in a fourth direction crossing the third direction and arranged at equal intervals.

13. The semiconductor memory device according to claim 12, further comprising insulating members disposed on both sides of the stacked body in a fifth direction, the third direction crossing the first direction and the second direction.

14. The semiconductor memory device according to claim 13, further comprising:

a semiconductor substrate on which the stacked body is disposed; and a conductive member provided in the insulating member and extending in the first direction, a lower end of the conductive member being connected to the semiconductor substrate.

15. The semiconductor memory device according to claim 12, wherein the plurality of columnar structures is arranged along a plurality of rows extending in the second direction.

16. The semiconductor memory device according to claim 15, wherein the columnar structures are periodically arranged along the second direction in each of the rows.

17. The semiconductor memory device according to claim 16, wherein positions of the columnar structures in the second direction are shifted from each other in the rows adjacent to each other.

* * * * *